US012787364B2

(12) United States Patent
Kim

(10) Patent No.: US 12,787,364 B2
(45) Date of Patent: Nov. 3, 2026

(54) SEMICONDUCTOR DEVICE AND METHOD FOR FABRICATING THE SAME

(71) Applicant: Samsung Electronics Co., Ltd., Suwon-si (KR)

(72) Inventor: Ki Joon Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 457 days.

(21) Appl. No.: 18/465,550

(22) Filed: Sep. 12, 2023

(65) Prior Publication Data

US 2024/0290891 A1 Aug. 29, 2024

(30) Foreign Application Priority Data

Feb. 27, 2023 (KR) ........................ 10-2023-0025890

(51) Int. Cl.
*H10D 30/67* (2025.01)
*H10D 30/43* (2025.01)
(Continued)

(52) U.S. Cl.
CPC ......... *H10D 30/6757* (2025.01); *H10D 30/43* (2025.01); *H10D 30/6735* (2025.01);
(Continued)

(58) Field of Classification Search
CPC ............... H10D 30/6757; H10D 30/43; H10D 30/6735; H10D 30/6739; H10D 62/80; H10D 84/85; H10D 87/00; H10D 99/00; H10D 30/014; H10D 62/121; H10D 62/151; H10D 64/671; H10D 30/675; H01L 21/02568
See application file for complete search history.

(56) References Cited

U.S. PATENT DOCUMENTS

| | | | |
|---|---|---|---|
| 10,388,732 B1 | 8/2019 | Frougier et al. |
| 2020/0235206 A1 | 7/2020 | Xu et al. |

(Continued)

OTHER PUBLICATIONS

Korean Office Action for corresponding Korean Application No. 10-2023-0025890 dated Jul. 7, 2026.

*Primary Examiner* — Mohammad A Rahman
(74) *Attorney, Agent, or Firm* — Harness, Dickey & Pierce, P.L.C.

(57) ABSTRACT

A semiconductor device including a substrate, a first bridge pattern spaced apart from the substrate and extending in a first direction and including a two-dimensional chalcogenide in which a semiconductor element and a chalcogen element are combined, a gate structure extending in a second direction intersecting the first direction and through which the first bridge pattern penetrates, a gate spacer extending along a side surface of the gate structure and through which the first bridge pattern penetrates and a source/drain pattern connected to the first bridge pattern on a side surface of the gate spacer, wherein the first bridge pattern includes a first chalcogenization portion overlapping the gate structure and a second chalcogenization portion overlapping the gate spacer, and a concentration of the chalcogen element in the second chalcogenization portion is lower than a concentration of the chalcogen element in the first chalcogenization portion, may be provided.

20 Claims, 35 Drawing Sheets

(51) Int. Cl.

| | |
|---|---|
| ***H10D 62/80*** | (2025.01) |
| ***H10D 84/85*** | (2025.01) |
| ***H10D 87/00*** | (2026.01) |
| ***H10D 99/00*** | (2025.01) |

(52) U.S. Cl.
CPC ......... *H10D 30/6739* (2025.01); *H10D 62/80* (2025.01); *H10D 84/85* (2025.01); *H10D 87/00* (2025.01); *H10D 99/00* (2025.01)

(56) References Cited

U.S. PATENT DOCUMENTS

| | | | | |
|---|---|---|---|---|
| 2020/0251160 | A1* | 8/2020 | Sharma ................ | H10B 12/315 |
| 2021/0305372 | A1 | 9/2021 | Khaderbad et al. | |
| 2021/0391478 | A1 | 12/2021 | Maxey et al. | |
| 2021/0408375 | A1 | 12/2021 | Dorow et al. | |
| 2022/0045176 | A1 | 2/2022 | Sathaiya et al. | |
| 2022/0077321 | A1 | 3/2022 | Seol et al. | |
| 2022/0140098 | A1 | 5/2022 | Cheng et al. | |
| 2022/0293736 | A1* | 9/2022 | Khaderbad .......... | H10D 30/751 |
| 2023/0413684 | A1* | 12/2023 | Debashis ............... | H10N 50/20 |
| 2024/0222483 | A1* | 7/2024 | Naylor ................. | H10D 30/014 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2023-0025890 filed on Feb. 27, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices and methods for fabricating the same, and more particularly, to semiconductor devices using a two-dimensional semiconductor material as a channel and methods for fabricating the same.

2. Description of the Related Art

As one of the scaling techniques for increasing density of an integrated circuit device, a multi-gate transistor in which a fin-shaped or a nanowire-shaped silicon body is formed on a substrate, and a gate is formed on a surface of the silicon body has been proposed.

Because such a multi-gate transistor uses a three-dimensional channel, it is easy to perform scaling. In addition, it is possible to improve current control capability even without increasing a length of the gate of the multi-gate transistor. Furthermore, it is possible to effectively suppress a short channel effect (SCE) that a potential of a channel region is affected by a drain voltage.

Meanwhile, as a method for improving performance of a semiconductor device by improving mobility and short channel effect (SCE), a semiconductor device using a two-dimensional semiconductor material as a channel is being studied.

SUMMARY

Some example embodiments of the present disclosure provide semiconductor devices with improved performance using a two-dimensional semiconductor material.

Some example embodiments of the present disclosure provide methods for fabricating a semiconductor device with improved performance using a two-dimensional semiconductor material.

According to an example embodiment of the present disclosure, a semiconductor device may include a substrate, a first bridge pattern spaced apart from the substrate and extending in a first direction, the first bridge pattern including a two-dimensional chalcogenide in which a semiconductor element and a chalcogen element are combined, a gate structure extending in a second direction intersecting the first direction on the substrate, the first bridge pattern penetrating through the gate structure, a gate spacer extending along a side surface of the gate structure, the first bridge pattern penetrating through the gate structure, and a source/drain pattern connected to the first bridge pattern on a side surface of the gate spacer, wherein the first bridge pattern includes a first chalcogenization portion overlapping the gate structure and a second chalcogenization portion overlapping the gate spacer, and a concentration of the chalcogen element in the second chalcogenization portion is lower than a concentration of the chalcogen element in the first chalcogenization portion.

According to an example embodiment of the present disclosure, a semiconductor device may include a substrate, a bridge pattern spaced apart from the substrate and extending in a first direction, the bridge pattern including a two-dimensional chalcogenide, a gate structure extending in a second direction intersecting the first direction on the substrate, the bridge pattern penetrating through the gate structure, and a source/drain pattern connected to the bridge pattern on a side surface of the gate structure, wherein, the two-dimensional chalcogenide is a semiconductor material layer including a chalcogen element.

According to an example embodiment of the present disclosure, a semiconductor device may include a substrate, a plurality of bridge patterns sequentially stacked on the substrate, spaced apart from each other, and extending in a first direction, a gate electrode extending in a second direction intersecting the first direction on the substrate, the plurality of bridge pattern penetrating through the gate electrode, a gate spacer extending along a side surface of the gate electrode, the plurality of bridge patterns penetrating through the gate electrode, a gate dielectric film interposed between each of the bridge patterns and the gate electrode and between the gate electrode and the gate spacer and a source/drain pattern connected to the plurality of bridge patterns on a side surface of the gate spacer, wherein each of the bridge patterns includes a first chalcogenization portion overlapping the gate electrode and a second chalcogenization portion overlapping the gate spacer, the first chalcogenization portion includes $Si_2Te_{3-x}$ (where $0 \le x < 3$), and the second chalcogenization portion includes $Si_2Te_{3-y}$ (where $y > x$ and $0 < y \le 3$).

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

Terms "first", "second" and the like are used herein to describe various elements or components, but these elements or components are not limited by these terms. These terms are used only to distinguish one element or component from another element or component. Therefore, a first element or component mentioned below may be a second element or component within the technical spirit of the present disclosure.

In addition, in the present specification, the term "same" refers to the meaning including not only the completely same, but also a fine difference that may occur due to a margin in a process or the like.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements, modify the entire list of elements and do not modify the individual elements of the list. For example, an expression such as "at least one of A, B, and C" or "at least one selected from the group consisting of A, B, and C" may be interpreted as only A, only B, only C, or any combination of two or more of A, B, and C, such as A, B, and C, A and B, B and C, and A and C.

Hereinafter, semiconductor devices according to some example embodiments will be described with reference to FIGS. 1 to 14.

Figure 1:
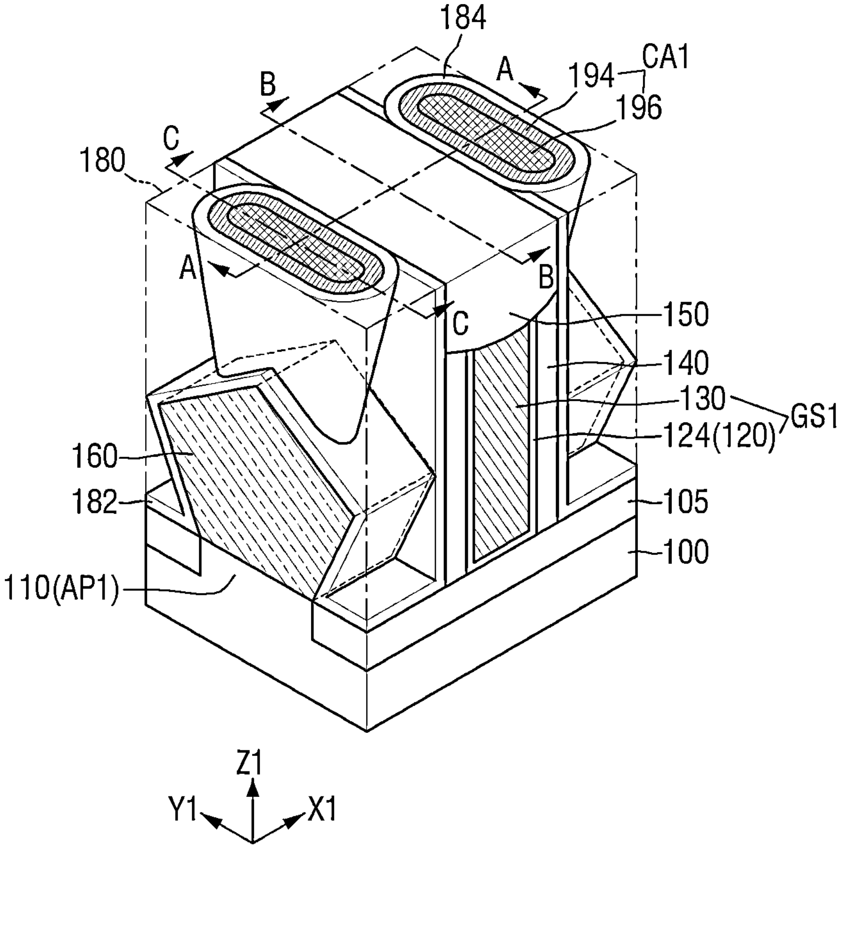
FIG. 1 is a perspective view for describing a semiconductor device according to an example embodiment.
Figure 2:
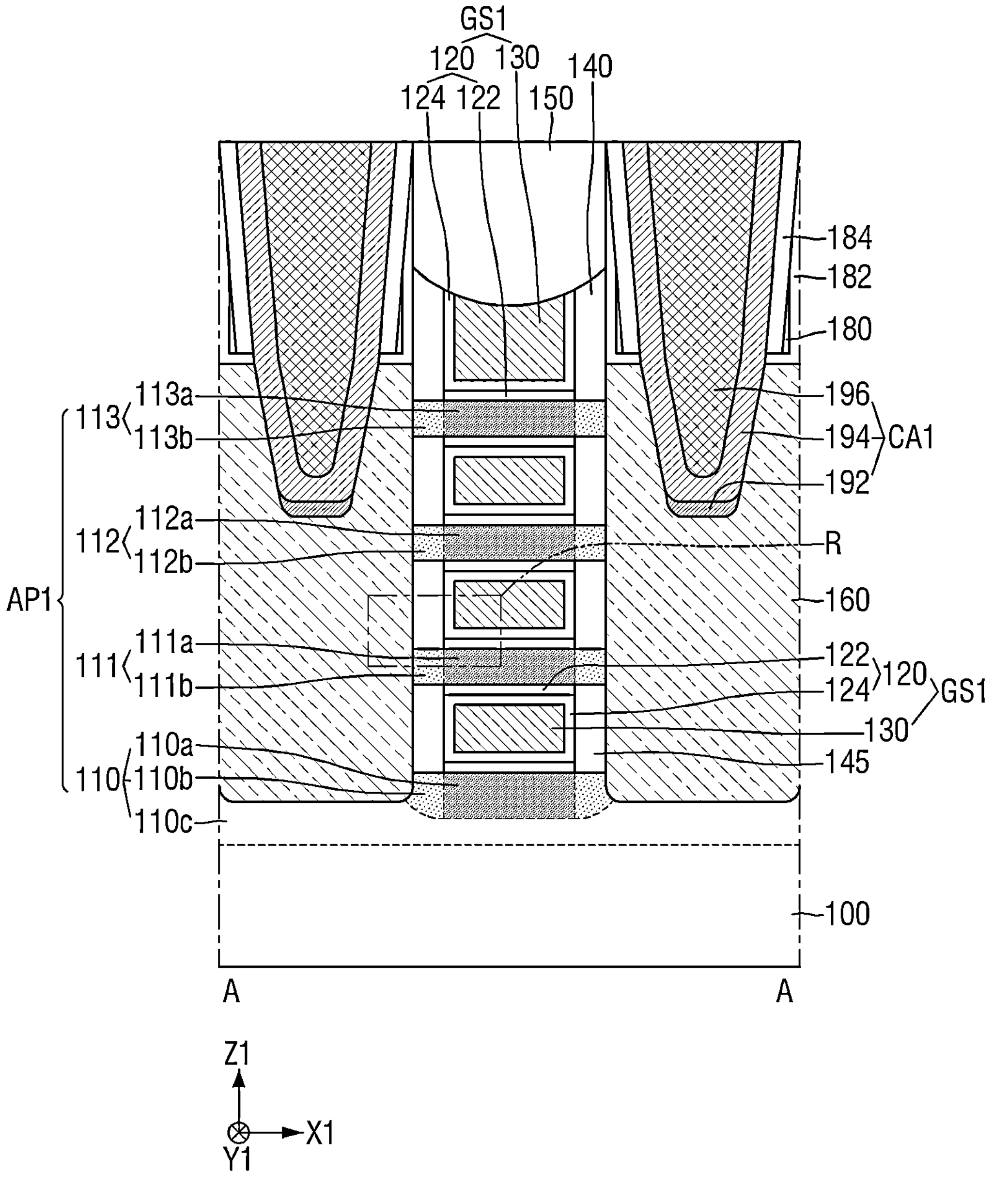
FIG. 2 is a cross-sectional view taken along line A-A of FIG. 1.
Figure 3:
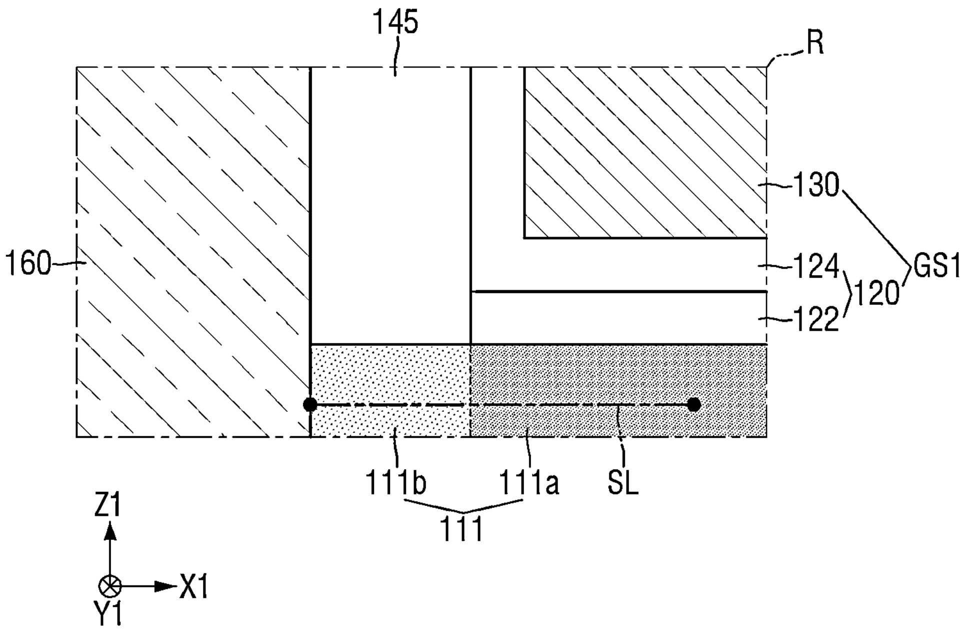
FIG. 3 is an enlarged view for describing area R of FIG. 2.
Figure 4A:
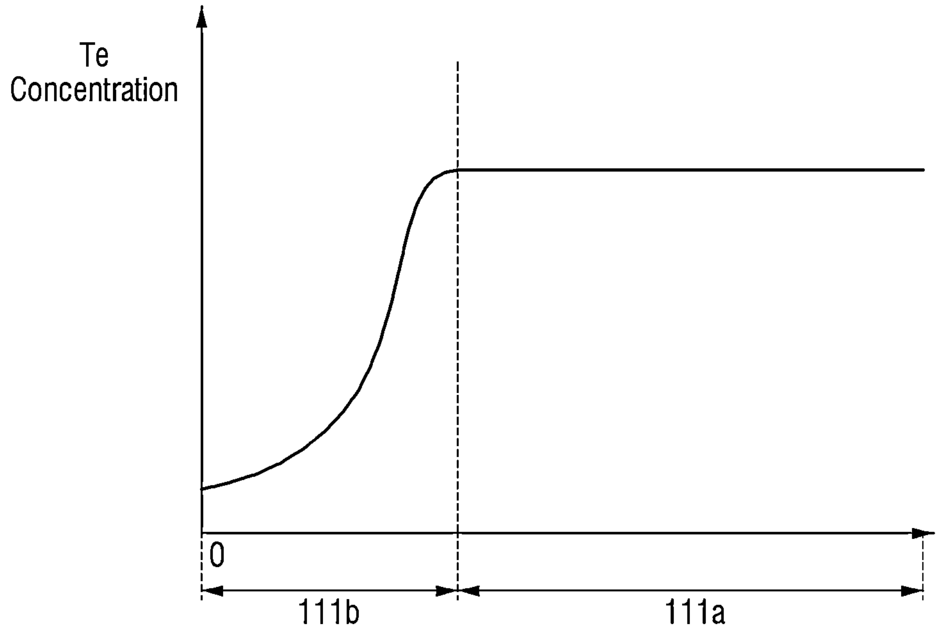
FIGS. 4*a* and 4*b* are example graphs for describing a concentration of a chalcogen element along an SL line of FIG. 3.
Figure 4B:
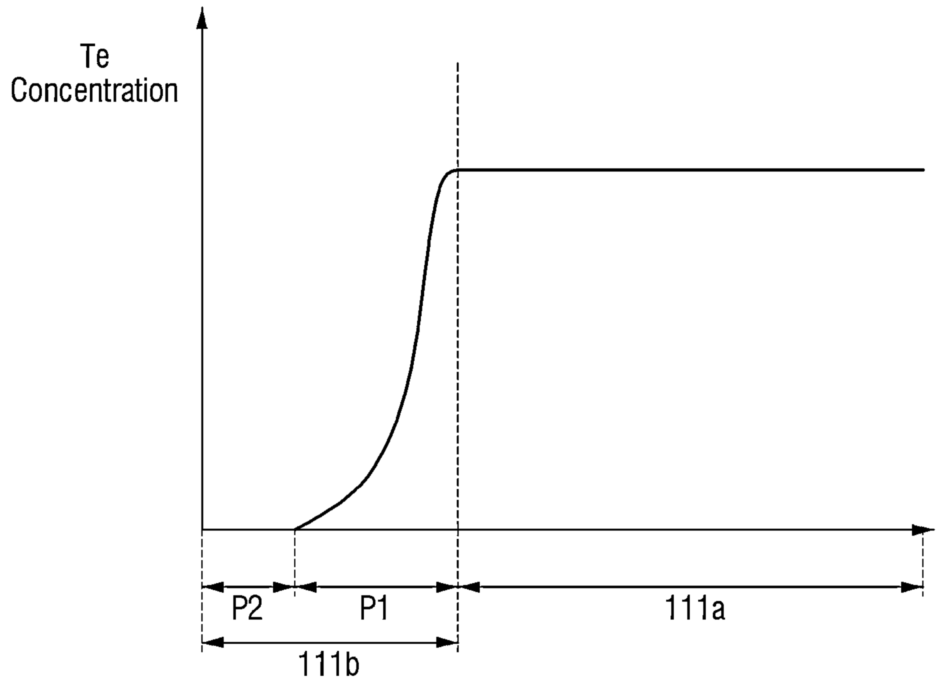
Figure 5:
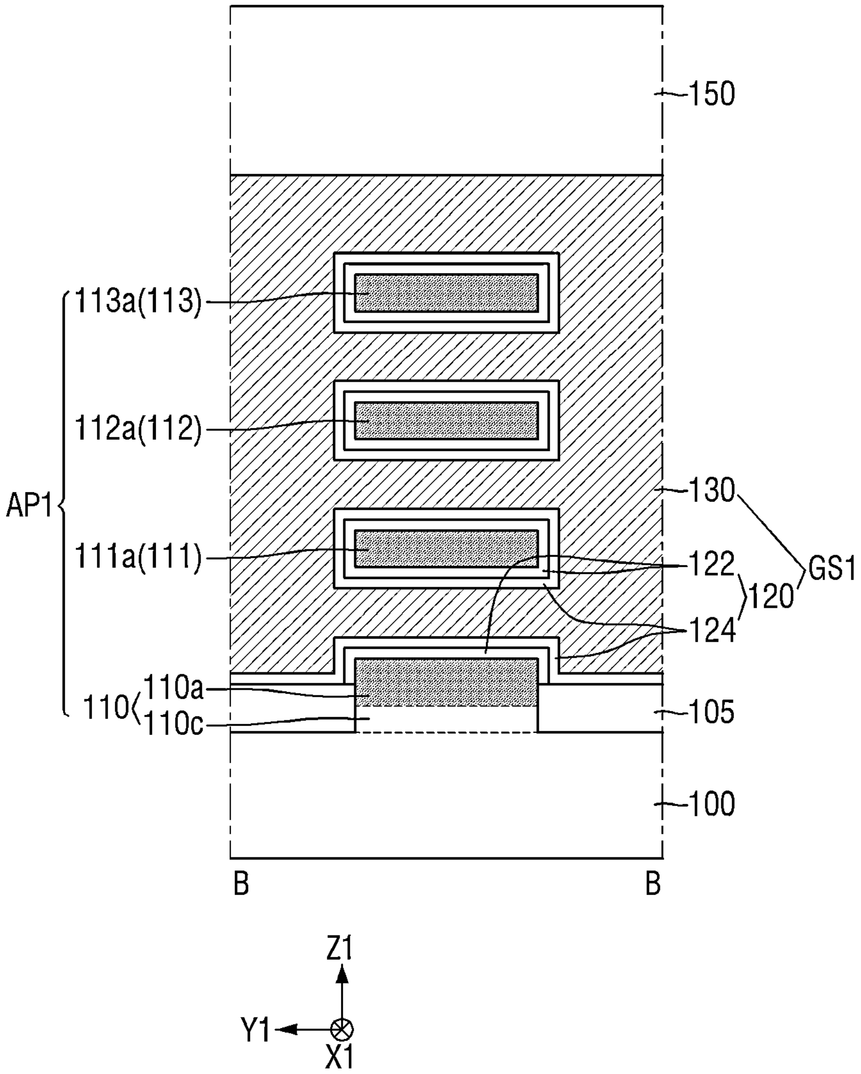
FIG. 5 is a cross-sectional view taken along line B-B of FIG. 1.
Figure 6:
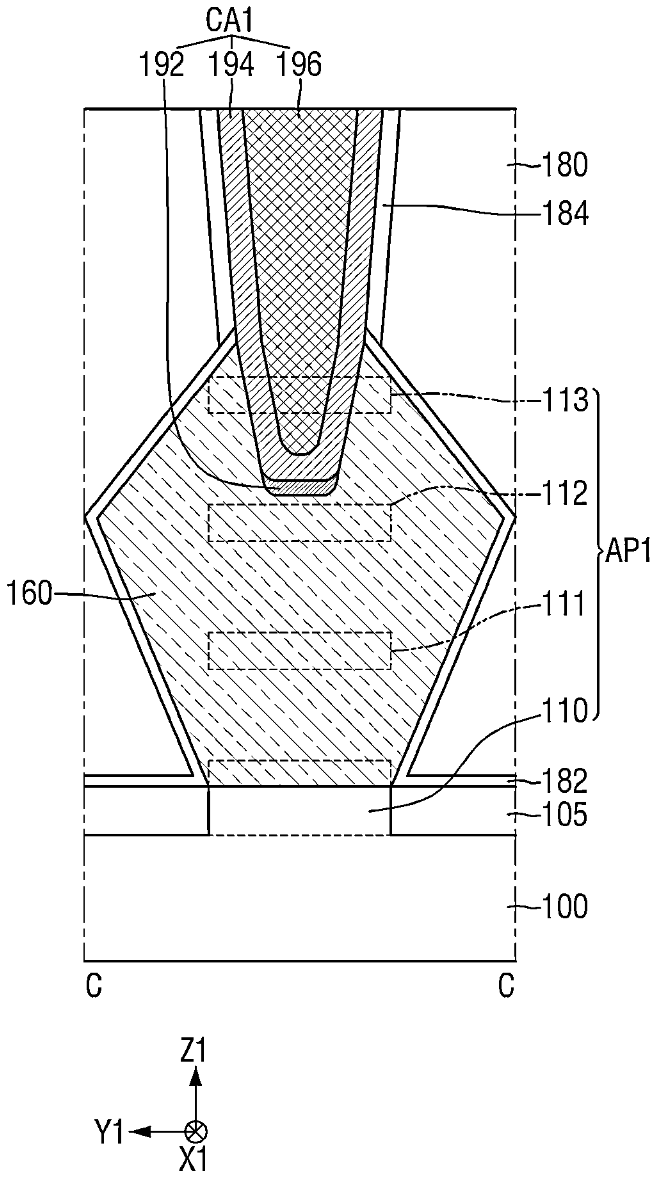
FIG. 6 is a cross-sectional view taken along line C-C of FIG. 1.

FIG. 1 is a perspective view for describing a semiconductor device according to an example embodiment. FIG. 2 is a cross-sectional view taken along line A-A of FIG. 1. FIG. 3 is an enlarged view for describing area R of FIG. 2. FIGS. 4*a* and 4*b* are example graphs for describing a concentration of a chalcogen element along an SL line of FIG. 3. FIG. 5 is a cross-sectional view taken along line B-B of FIG. 1. FIG. 6 is a cross-sectional view taken along line C-C of FIG. 1.

Referring to FIGS. 1 to 6, a semiconductor device according to an example embodiment includes a substrate 100, a first field insulating film 105, a first active pattern AP1, a first gate structure GS1, a first gate spacer 140, a first gate capping pattern 150, a first source/drain pattern 160, a first interlayer insulating film 180, and a first source/drain contact CA1.

The substrate 100 may be bulk silicon or silicon-on-insulator (SOI). Unlike this, the substrate 100 may also be a silicon substrate, or may also include another material, for example, silicon germanium, silicon germanium on insulator (SGOI), indium antimonide, a lead tellurium compound, indium arsenide, indium phosphide, gallium arsenide, or gallium antimonide. In some example embodiments, the substrate 100 may have an epitaxial layer formed on a base substrate. For convenience of explanation, the substrate 100 will be described below as being a silicon substrate.

The first active pattern AP1 may be formed on the substrate 100. The first active pattern AP1 may extend to be long along the first direction X1 on the substrate 100. In some example embodiments, the first active pattern AP1 may include a plurality of bridge patterns (e.g., first to third bridge patterns 111 to 113) that are sequentially stacked on an upper surface of the substrate 100 and are spaced apart from each other and each extend in a first direction X1. The first active pattern AP1 may be used as a channel region of a Multi-Bridge-Channel FET MBCFET® including a multi-bridge channel. The number of bridge patterns included in the first active pattern AP1 is only an example, and is not limited to that illustrated.

In some example embodiments, the first active pattern AP1 may further include a first fin pattern 110. The first fin pattern 110 may protrude from the upper surface of the substrate 100 and extend in the first direction X1. The first fin pattern 110 may also be formed by etching a portion of the substrate 100 and growing an epitaxial layer on the substrate 100. The first to third bridge patterns 111 to 113 may be sequentially stacked on an upper surface of the first fin pattern 110.

The first active pattern AP1 may include a two-dimensional chalcogenide in which a semiconductor element and a chalcogen element are combined. The two-dimensional chalcogenide may have a two-dimensional semiconductor phase, thereby being used as a channel region to provide improved performance.

The semiconductor element may include an elemental semiconductor such as silicon (Si) or germanium (Ge). In some example embodiments, the semiconductor element may also include a compound semiconductor, for example, a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element. The group III-V compound semiconductor may be, for example, one of a binary compound, a ternary compound, or a quaternary compound formed by combining at least one of aluminum (Al), gallium (Ga), and indium (In), which are group III elements, and at least one of phosphorus (P), arsenic (As), and antimony (Sb), which are group V elements. In some example embodiments, the semiconductor element may be one or more elements selected from the group consisting of silicon (Si) and germanium (Ge).

The chalcogen element is an element belonging to group 16 of the periodic table, and may include at least one of oxygen (O), sulfur (S), selenium (Se), tellurium (Te), polonium (Po), and livermorium (Lv). In some example embodiments, the chalcogen element may be one or more elements selected from the group consisting of sulfur (S), selenium (Se), and tellurium (Te).

In some example embodiments, the two-dimensional chalcogenide may include a compound represented by Chemical Formula $A_2B_3$. In Chemical Formula $A_2B_3$, A represents one or more semiconductor elements selected from the group consisting of silicon (Si) and germanium (Ge). In addition, in Chemical Formula $A_2B_3$, B represents one or more chalcogen elements selected from the group consisting of sulfur (S), selenium (Se), and tellurium (Te). For example, the two-dimensional chalcogenide may include at least one of silicon sulfide ($Si_2S_3$), silicon selenide ($Si_2Se_3$), silicon telluride ($Si_2Te_3$), germanium sulfide ($Ge_2S_3$), germanium selenide ($Ge_2Se_3$), and germanium telluride ($Ge_2Te_3$). For example, the two-dimensional chalcogenide may include silicon telluride ($Si_2Te_3$).

In some example embodiments, the two-dimensional chalcogenide may be formed by implanting the chalcogen element into a semiconductor material layer including the semiconductor element. For example, the semiconductor material layer may include an elemental semiconductor such as silicon (Si) or germanium (Ge). In some example embodiments, the semiconductor material layer may also include a compound semiconductor, for example, the group IV-IV compound semiconductor or the group III-V compound semiconductor. This will be described later in more detail in the description of FIGS. 23 to 34.

In some example embodiments, the first active pattern AP1 may include the 2D chalcogenide doped with an impurity element. The impurity element may include various elements for improving performance of the semiconductor device including the first active pattern AP1. For example, the impurity element may include at least one of a p-type impurity such as B, $BF_3$, $BH_3$, Ga or In, an n-type impurity such as P, N, As, Sb, Bi or F, an intrinsic impurity such as C, Ge or Sn, and a combination thereof, but is not limited thereto.

The first field insulating film 105 may be formed on the substrate 100. The first field insulating film 105 may include, for example, at least one of silicon oxide, silicon nitride, silicon oxynitride, and a combination thereof, but is not limited thereto.

In some example embodiments, the first field insulating film 105 may cover at least a portion of a side surface of the first active pattern AP1. For example, the first field insulating film 105 may cover a portion of a side surface of the first fin pattern 110. It is only illustrated that an upper portion of the first fin pattern 110 protrudes from an upper surface of the first field insulating film 105, but this is only an example. As another example, the upper surface of the first field insulating film 105 may also be disposed on the same plane as the upper surface of the first fin pattern 110.

The first gate structure GS1 may be formed on the substrate 100 and the first field insulating film 105. The first gate structure GS1 may intersect the first active pattern AP1. For example, the first gate structure GS1 may extend in a second direction Y1 that is parallel to the upper surface of the substrate 100 and intersects the first direction X1. Each of the bridge patterns 111 to 113 of the first active pattern AP1 may extend in the first direction X1 and penetrate through the first gate structure GS1. That is, the first gate structure GS1 may surround a circumference of each of the bridge patterns 111 to 113.

The first gate structure GS1 may include a first gate dielectric film 120 and a first gate electrode 130. The first gate dielectric film 120 and the first gate electrode 130 may be sequentially stacked on the first active pattern AP1. The first gate structure GS1 may be formed by, for example, a replacement process, but is not limited thereto.

The first gate dielectric film 120 may surround the circumference of each of the bridge patterns 111 to 113. In addition, the first gate dielectric film 120 may extend along an upper surface of the first field insulating film 105 and a surface of the first fin pattern 110 protruding from the first field insulating film 105.

The first gate dielectric film 120 may include, for example, at least one of silicon oxide, silicon oxynitride, silicon nitride, or a high-k material having a dielectric constant greater than that of silicon oxide. The high-k material may include, for example, at least one of hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), and a combination thereof, but is not limited thereto.

In some example embodiments, the first gate dielectric film 120 may include a first interface film 122 and a first high-k dielectric film 124 sequentially stacked on the first active pattern AP1.

The first interface film 122 may conformally extend along the circumference of each of the bridge patterns 111 to 113. In addition, the first interface film 122 may conformally extend along the surface of the first fin pattern 110 exposed from the first field insulating film 105. The first interface film 122 may include, for example, at least one of silicon oxide, silicon oxynitride, and silicon nitride. In some example embodiments, the first interface film 122 may include an oxide of the first active pattern AP1.

The first high-k dielectric film 124 may conformally extend along a circumference of the first interface film 122. In addition, the first high-k dielectric film 124 may extend along the upper surface of the first field insulating film 105 and the surface of the first fin pattern 110 protruding from the first field insulating film 105. The first high-k dielectric film 124 may include, for example, the high-k material.

The semiconductor device according to some example embodiments may include a negative capacitance (NC) FET using a negative capacitor. For example, the first gate dielectric film 120 may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material film having the negative capacitance and the paraelectric material film having the positive capacitance are connected in series with each other, a total capacitance value of the ferroelectric material film and the paraelectric material film connected in series with each other may increase. A transistor including the ferroelectric material film may have a subthreshold swing (SS) less than 60 mV/decade at room temperature, using the increase in the total capacitance value.

The ferroelectric material film may have the ferroelectric characteristics. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may vary depending on a type of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 atomic % (at %) of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have the paraelectric characteristics. The paraelectric material film may include, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include the same material. The ferroelectric material film may have the ferroelectric characteristics, but the paraelectric material film may not have the ferroelectric characteristics. For example, when the ferroelectric material film and the paraelectric material film include hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may vary for each ferroelectric material, the thickness of the ferroelectric material film may vary depending on the ferroelectric material.

As an example, the first gate dielectric film 120 may include one ferroelectric material film. As another example, the first gate dielectric film 120 may include a plurality of ferroelectric material films spaced apart from each other. The first gate dielectric film 120 may have a stacked film structure in which a plurality of ferroelectric material films and a plurality of paraelectric material films are alternately stacked.

The first gate electrode 130 may be stacked on the first gate dielectric film 120. That is, the first gate dielectric film 120 may be interposed between the first active pattern AP1 and the first gate electrode 130. It is only illustrated that the first gate electrode 130 is a single film, but this is only an example, and the first gate electrode 130 may also be formed by stacking a plurality of conductive films. For example, the first gate electrode 130 may include a work function adjusting film for adjusting a work function and a filling conductive film filling a space formed by the work function adjusting film. The work function adjusting film may include, for example, at least one of TiN, TaN, TiC, TaC, TiAlC, and a combination thereof. The filling conductive film may include, for example, W or Al.

The first gate spacer 140 may be formed on the substrate 100 and the first field insulating film 105. The first gate spacer 140 may extend along a side surface of the first gate electrode 130. The first gate spacer 140 may include, for example, at least one of silicon nitride, silicon oxynitride, silicon oxycarbide, silicon boron nitride, silicon carbonitride, silicon oxycarbonitride, and a combination thereof, but is not limited thereto.

In some example embodiments, a portion of the first gate dielectric film 120 may be interposed between the first gate electrode 130 and the first gate spacer 140. For example, the first high-k dielectric film 124 may further extend along at least a portion of an inner side surface of the first gate spacer 140.

The first gate capping pattern 150 may be formed on the first gate electrode 130. The first gate capping pattern 150 may extend along the upper surface of the first gate electrode 130. The first gate capping pattern 150 may include, for example, at least one of silicon nitride, silicon oxynitride, silicon oxycarbide, silicon boron nitride, silicon carbonitride, silicon oxycarbonitride, and a combination thereof, but is not limited thereto.

In some example embodiments, the first gate capping pattern 150 may cover the upper surface of the first gate electrode 130 and an upper surface of the first gate spacer 140. In some example embodiments, the upper surface of the first gate electrode 130 and the upper surface of the first gate spacer 140 may include a concave surface.

In some example embodiments, internal spacers 145 may be formed on side surfaces of the first gate structure GS1. The internal spacers 145 may be formed on the side surfaces of the first gate structure GS1 between the first to third bridge patterns 111 to 113. In addition, the internal spacer 145 may also be formed on the side surface of the first gate structure GS1 between the first fin pattern 110 and the first bridge pattern 111. The first gate electrode 130 may be separated from the first source/drain pattern 160 by the first gate dielectric film 120, the first gate spacer 140, and/or the internal spacer 145.

The internal spacer 145 may include, for example, at least one of silicon nitride, silicon oxynitride, silicon oxycarbide, silicon boron nitride, silicon carbonitride, silicon oxycarbonitride, and a combination thereof, but is not limited thereto. The internal spacer 145 may also include the same material as the first gate spacer 140 or a material different from that of the first gate spacer 140. It is only illustrated that a thickness of the internal spacer 145 is the same as that of the first gate spacer 140, but this is only an example.

The first source/drain pattern 160 may be formed on the upper surface of the substrate 100 and at least one side surface (e.g., both side surfaces) of the first gate structure GS1. In addition, the first source/drain pattern 160 may be connected to the first active pattern AP1. For example, each of the first to third bridge patterns 111 to 113 may penetrate through the first gate structure GS1 and the first gate spacer 140 and be connected to the first source/drain pattern 160. The first source/drain pattern 160 may be separated from the first gate electrode 130 by the first gate dielectric film 120 and/or the first gate spacer 140. The first source/drain pattern 160 may be provided as a source/drain region.

In some example embodiments, the first source/drain pattern 160 may include an epitaxial layer. For example, the first source/drain pattern 160 may be formed by an epitaxial growth method. It is only illustrated in FIGS. 1 and 6 that a cross section of the first source/drain pattern 160 has a pentagonal shape, but this is only an example. Depending on epitaxial growth conditions, the cross section of the first source/drain pattern 160 may vary, such as a hexagonal shape or a diamond shape.

When the first source/drain pattern 160 is provided as a source/drain region of a PFET, the first source/drain pattern 160 may include p-type impurities or impurities for blocking or preventing diffusion of p-type impurities. For example, the first source/drain pattern 160 may include at least one of B, C, In, Ga, Al, and a combination thereof.

In some example embodiments, when the first source/drain pattern 160 is provided as the source/drain region of the PFET, the first source/drain pattern 160 may further include a compressive stress material. For example, when the first active pattern AP1 includes silicon (Si), the first source/drain pattern 160 may include a material (e.g., silicon germanium (SiGe)) having a smaller lattice constant than silicon (Si). The compressive stress material may improve carrier mobility in a channel region by applying compressive stress to the first active pattern AP1.

When the first source/drain pattern 160 is provided as a source/drain region of an NFET, the first source/drain pattern 160 may include n-type impurities or impurities for blocking or preventing diffusion of n-type impurities. For example, the first source/drain pattern 160 may include at least one of P, Sb, As, and a combination thereof.

In some example embodiments, when the first source/drain pattern 160 is provided as the source/drain region of the NFET, the first source/drain pattern 160 may further include a tensile stress material. For example, when the first active pattern AP1 includes silicon (Si), the first source/drain pattern 160 may include a material (e.g., silicon carbide (SiC)) having a smaller lattice constant than silicon (Si). The tensile stress material may improve carrier mobility in a channel region by applying tensile stress to the first active pattern AP1.

The first active pattern AP1 may include first chalcogenization portions 110*a* to 113*a* and second chalcogenization portions 110*b* to 113*b*. The first chalcogenization portions 110*a* to 113*a* may overlap the first gate structure GS1, and the second chalcogenization portions 110*b* to 113*b* may overlap the first gate spacer 140. Here, the overlapping means overlapping in a third direction Z1 intersecting the first direction X1 and the second direction Y1 (or intersecting the upper surface of the substrate 100). For example, each of the bridge patterns 111 to 113 may include a corresponding one of the first chalcogenization portions 111*a* to 113*a* overlapping the first gate structure GS1 and a corresponding one of the second chalcogenization portions 111*b* to 113*b* overlapping the first gate spacer 140. In some example embodiments, the first fin pattern 110 may include the first chalcogenization portion 110*a* overlapping the first gate structure GS1 and the second chalcogenization portion 110*b* overlapping the first gate spacer 140.

The first chalcogenization portions 110*a* to 113*a* and the second chalcogenization portions 110*b* to 113*b* may each include the two-dimensional chalcogenide in which the semiconductor element and the chalcogen element are combined. In this case, a concentration of the chalcogen element in the second chalcogenization portions 110*b* to 113*b* may be lower than a concentration of the chalcogen element in the first chalcogenization portions 110*a* to 113*a*. As an example, the two-dimensional chalcogenide may be silicon telluride ($Si_2Te_3$), and a concentration of tellurium (Te) in the second chalcogenization portions 110*b* to 113*b* may be lower than a concentration of tellurium (Te) in the first chalcogenization portions 110*a* to 113*a*. For example, the first chalcogenization portions 110*a* to 113*a* may include $Si_2Te_{3-x}$ (where $0 \leq x < 3$), and the second chalcogenization portions 110*b* to 113*b* may include $Si_2Te_{3-y}$ (where $y > x$ and $0 < y \leq 3$).

In some example embodiments, as illustrated in FIGS. 4*a* and 4*b*, the concentration of the chalcogen element (e.g., concentration of tellurium (Te)) in the second chalcogenization portions 110*b* to 113*b* may decrease as a distance from the first chalcogenization portions 110*a* to 113*a* increases.

In some example embodiments, some of the second chalcogenization portions 110*b* to 113*b* may not include the two-dimensional chalcogenide. For example, as illustrated in FIG. 4*b*, the second chalcogenization portions 110*b* to 113*b* may include a first portion P1 adjacent to the first chalcogenization portions 110*a* to 113*a* and a second portion P2 spaced apart from the first chalcogenization portion 110*a* to 113*a*. The concentration of the chalcogen element (e.g., the concentration of tellurium (Te)) in the first portion P1 of the second chalcogenization portions 110*b* to 113*b* may decrease as the distance from the first chalcogenization portions 110*a* to 113*a* increases. The second portion P2 of the second chalcogenization portions 110*b* to 113*b* may include the semiconductor element (e.g., silicon (Si)), and may not include the chalcogen element (e.g., tellurium (Te)).

In some example embodiments, the first fin pattern 110 may further include a base portion 110*c*. The base portion 110*c* may not include the two-dimensional chalcogenide. For example, the base portion 110*c* may include the semiconductor element (e.g., silicon (Si)) and may not include the chalcogen element (e.g., tellurium (Te)). The first chalcogenization portion 110*a* of the first fin pattern 110 may be interposed between the base portion 110*c* and the first gate structure GS1. The second chalcogenization portion 110*b* of the first fin pattern 110 may be interposed between the base portion 110*c* and the first gate spacer 140.

It is illustrated that a thickness of the first chalcogenization portions 110*a* to 113*a* is the same as that of the second chalcogenization portions 110*b* to 113*b*, but this is only an example. Here, the thickness refers to a thickness in the third direction Z1. As an example, as the concentration of the chalcogen element implanted into the first chalcogenization portions 110*a* to 113*a* is higher than the concentration of the chalcogen element implanted into the second chalcogenization portions 110*b* to 113*b*, the thickness of the first chalcogenization portions 110*a* to 113*a* may be greater than the thickness of the second chalcogenization portions 110*b* to 113*b*.

The first interlayer insulating film 180 may be formed on the substrate 100 and the first field insulating film 105. The first interlayer insulating film 180 may fill a space on an outer side of the first gate spacer 140. For example, the first interlayer insulating film 180 may cover the first field insulating film 105 and the first source/drain pattern 160.

The first interlayer insulating film 180 may include, for example, at least one of silicon oxide, silicon nitride, silicon oxynitride, silicon oxycarbide, silicon boron nitride, silicon carbonitride, silicon oxycarbonitride, and a low-k material having a dielectric constant smaller than that of silicon oxide. The low-k material may include, for example, at least one of flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and a combination thereof, but is not limited thereto.

In some example embodiments, a first liner film 182 covering the first source/drain pattern 160 may be formed. The first liner film 182 may conformally extend along a profile of the surface of the first source/drain pattern 160. The first liner film 182 may further extend along the upper surface of the first field insulating film 105 and the side surface of the first gate spacer 140. The first interlayer insulating film 180 may be formed on the first liner film 182.

The first liner film 182 may include a material having an etching selectivity with respect to the first interlayer insulating film 180. As an example, when the first interlayer insulating film 180 includes silicon oxide, the first liner film 182 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and a combination thereof. The first liner film 182 may serve as an etch stop layer in an etching process for the first interlayer insulating film 180.

The first source/drain contact CA1 may be connected to the first source/drain pattern 160. For example, the first source/drain contact CA1 may penetrate through the first interlayer insulating film 180 and be connected to the first source/drain pattern 160.

In some example embodiments, the first source/drain contact CA1 may include a first silicide film 192, a first barrier metal film 194, and a first metal film 196 sequentially stacked on the first source/drain pattern 160.

The first silicide film 192 may be interposed between the first source/drain pattern 160 and the first barrier metal film 194. The first silicide film 192 may include, for example, metal silicide such as nickel silicide, cobalt silicide, tungsten silicide, titanium silicide, niobium silicide, or tantalum silicide, but is not limited thereto. As an example, the first silicide film 192 may include titanium silicide. In some example embodiments, the first silicide film 192 may be formed by reacting an element included in the first barrier metal film 194 with the first source/drain pattern 160.

The first barrier metal film 194 and the first metal film 196 may be sequentially stacked on the first silicide film 192. The first barrier metal film 194 may include, for example, conductive metal nitride such as titanium nitride, tantalum nitride, or tungsten nitride, but is not limited thereto. As an example, the first barrier metal film 194 may include titanium nitride. The first metal film 196 may include, for example, a metal material such as cobalt (Co), titanium (Ti), tantalum (Ta), ruthenium (Ru), tungsten (W), or cobalt tungsten phosphorus (CoWP), but is not limited thereto. As an example, the first metal film 196 may include cobalt (Co).

In some example embodiments, a second liner film 184 may be formed on the first interlayer insulating film 180 and the first liner film 182. The second liner film 184 may conformally extend along a profile of a side surface of the first source/drain contact CA1. The second liner film 184 may include, for example, at least one of silicon oxide, silicon nitride, silicon oxynitride, silicon oxycarbide, silicon boron nitride, silicon carbonitride, silicon oxycarbonitride, and a low-k material having a dielectric constant smaller than that of silicon oxide.

FIGS. 7 to 10 are various cross-sectional views for describing a semiconductor device according to some example embodiments. For convenience of explanation, portions overlapping those described above with reference to FIGS. 1 to 6 will be briefly described or omitted.

Figure 7:
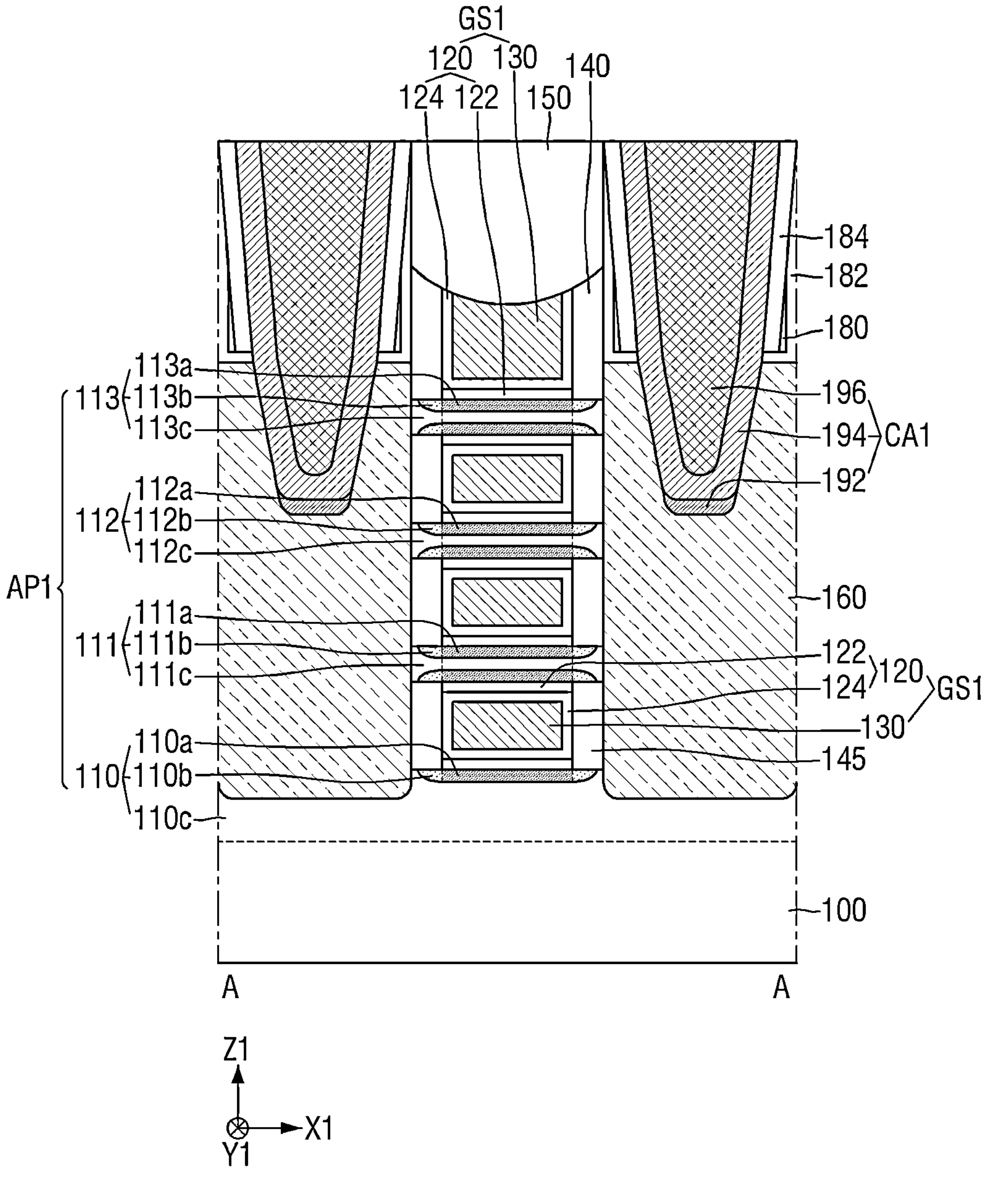
FIGS. 7 to 10 are various cross-sectional views for describing a semiconductor device according to some example embodiments.

Referring to FIG. 7, in a semiconductor device according to an example embodiment, each of the bridge patterns 111 to 113 further includes base portions 111*c* to 113*c*.

The base portions 111*c* to 113*c* may not include the two-dimensional chalcogenide. For example, the base portions 111*c* to 113*c* may include the semiconductor element (e.g., silicon (Si)) and may not include the chalcogen element (e.g., tellurium (Te)). The first chalcogenization portions 111*a* to 113*a* of each of the bridge patterns 111 to 113 may be interposed between the base portions 111*c* to 113*c* and the first gate structure GS1. The second chalcogenization portions 111*b* to 113*b* of each of the bridge patterns 111 to 113 may be interposed between the base portions 111*c* to 113*c* and the first gate spacer 140.

In some example embodiments, the second chalcogenization portions 110*b* to 113*b* of the first active pattern AP1 may not be in contact with the first source/drain pattern 160. For example, as illustrated, a portion of the base portions 110*c* to 113*c* may be interposed between the second chalcogenization portions 110*b* to 113*b* and the first source/drain pattern 160.

Figure 8:
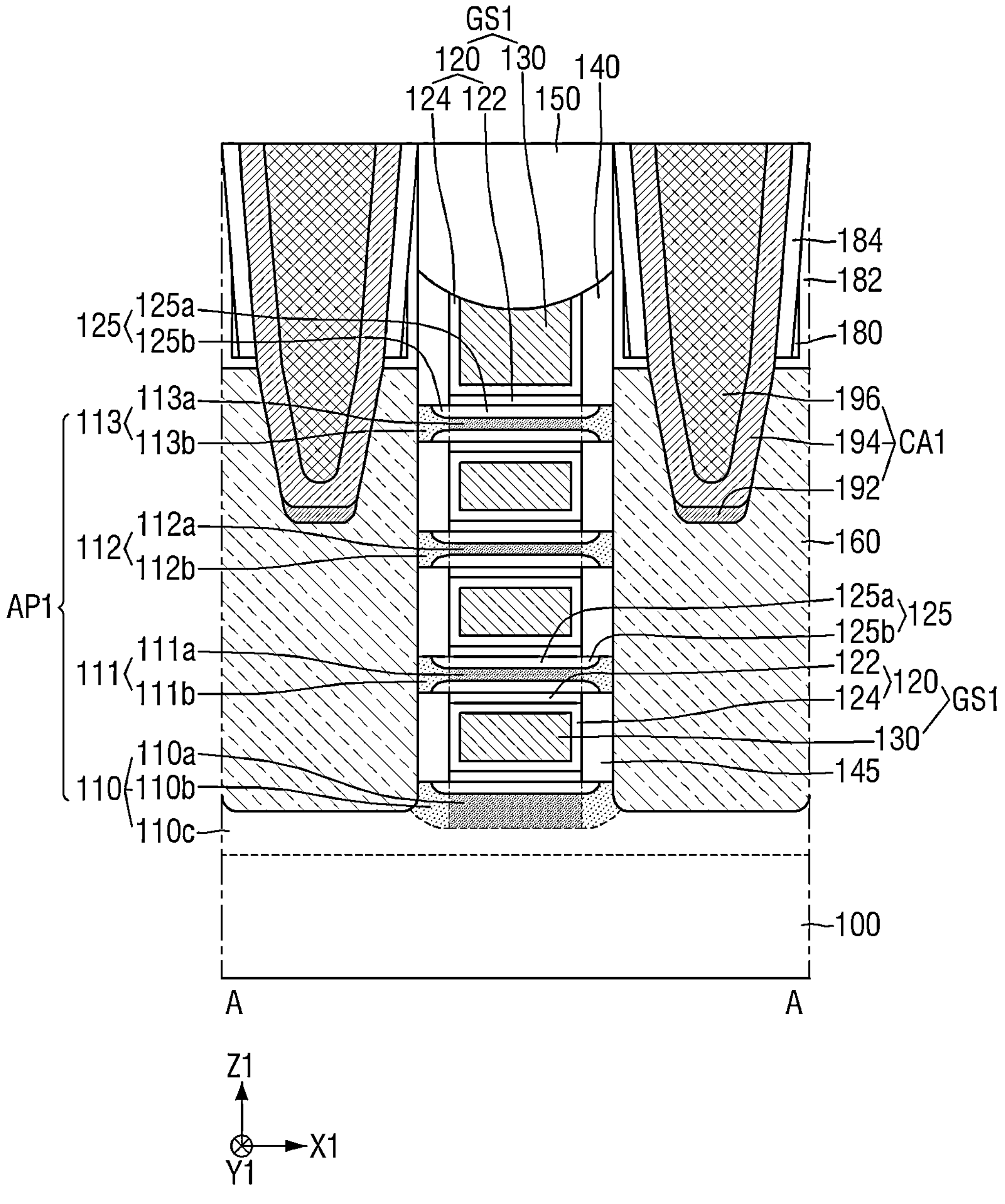

Referring to FIG. 8, a semiconductor device according to an example embodiment further include an oxide film 125.

The oxide film 125 may be interposed between the first active pattern AP1 and the first gate dielectric film 120. The oxide film 125 may be formed by oxidizing a portion of the first active pattern AP1 including the two-dimensional chalcogenide. For example, the oxide film 125 may include an oxide of the semiconductor element and an oxide of the chalcogen element. As an example, the two-dimensional chalcogenide may be silicon telluride ($Si_2Te_3$), and the oxide film 125 may include silicon oxide ($SiO_2$) and β-tellurium oxide (β-$TeO_2$). In some example embodiments, the oxide film 125 may be provided as a work function insulating film that adjusts a work function.

In some example embodiments, the oxide film 125 may include a first oxidizing portion 125*a* and a second oxidizing portion 125*b*. The first oxidizing portion 125*a* may overlap the first gate structure GS1, and the second oxidizing portion 125*b* may overlap the first gate spacer 140. The first oxidizing portion 125*a* may be formed by oxidizing a portion of the first chalcogenization portions 110*a* to 113*a*, and the second oxidizing portion 125*b* may be formed by oxidizing a portion of the second chalcogenization portions 110*b* to 113*b*.

In some example embodiments, the concentration of the chalcogen element in the second oxidizing portion 125*b* may be lower than the concentration of the chalcogen element in the first oxidizing portion 125*a*. As an example, the two-dimensional chalcogenide may be silicon telluride ($Si_2Te_3$), and a concentration of tellurium (Te) in the second oxidizing portion 125*b* may be lower than a concentration of tellurium (Te) in the first oxidizing portion 125*a*.

In some example embodiments, the oxide film 125 may not be in contact with the first source/drain pattern 160. For example, as illustrated, a portion of the second chalcogenization portions 110*b* to 113*b* of the first active pattern AP1 may be interposed between the second oxidizing portion 125*b* and the first source/drain pattern 160.

Figure 9:
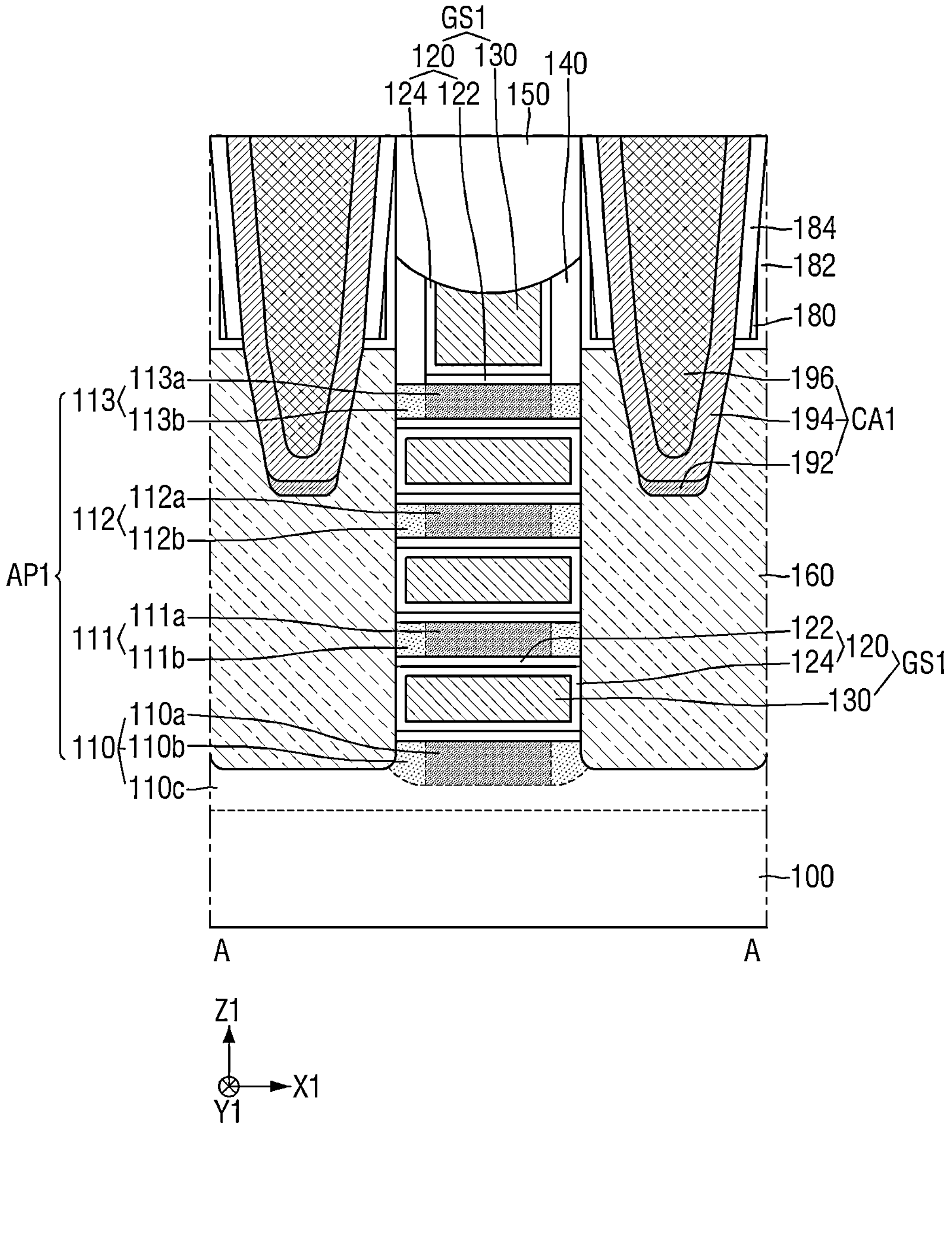

Referring to FIG. 9, a semiconductor device according to an example embodiment does not include the internal spacer (e.g., 145 in FIG. 2).

The first gate electrode 130 may be separated from the first source/drain pattern 160 by the first gate dielectric film 120 and/or the first gate spacer 140. For example, the first gate electrode 130 between the first to third bridge patterns 111 to 113 and the first gate electrode 130 between the first fin pattern 110 and the first bridge pattern 111 may be separated from the first source/drain pattern 160 by the first high-k dielectric film 124, respectively.

Figure 10:
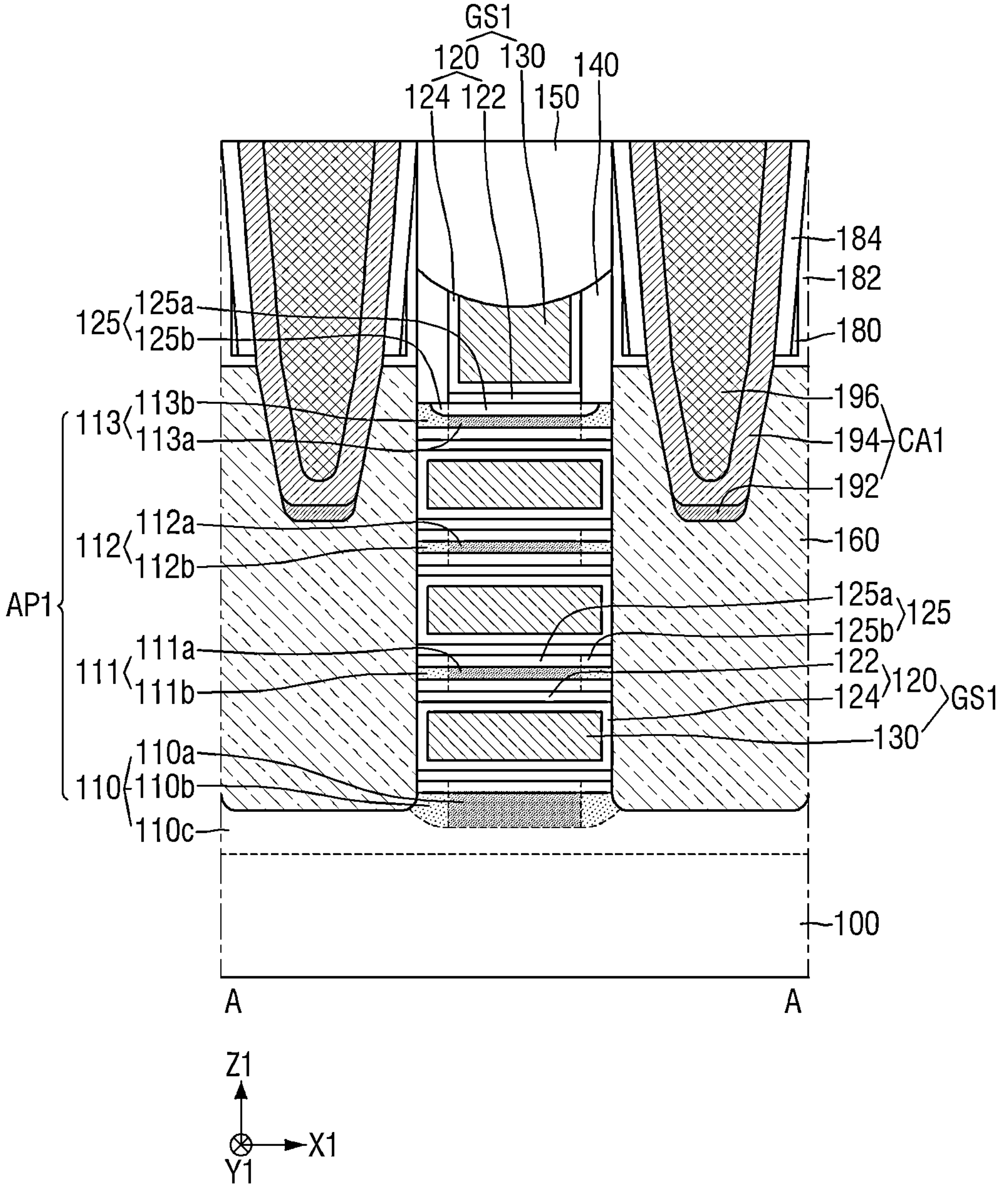

Referring to FIG. 10, a semiconductor device according to an example embodiment further includes an oxide film 125. Because the oxide film 125 is similar to that described above with reference to FIG. 8, a detailed description thereof will be omitted below.

At least a portion of the oxide film 125 may be in contact with the first source/drain pattern 160. For example, as illustrated, the oxide film 125 between the first to third bridge patterns 111 to 113 and the oxide film 125 between the first fin pattern 110 and the first bridge pattern 111 may be in contact with the first source/drain pattern 160, respectively.

The internal spacer (e.g., 145 in FIG. 2) may not be formed on the side surface of the first gate structure GS1.

Figure 11:
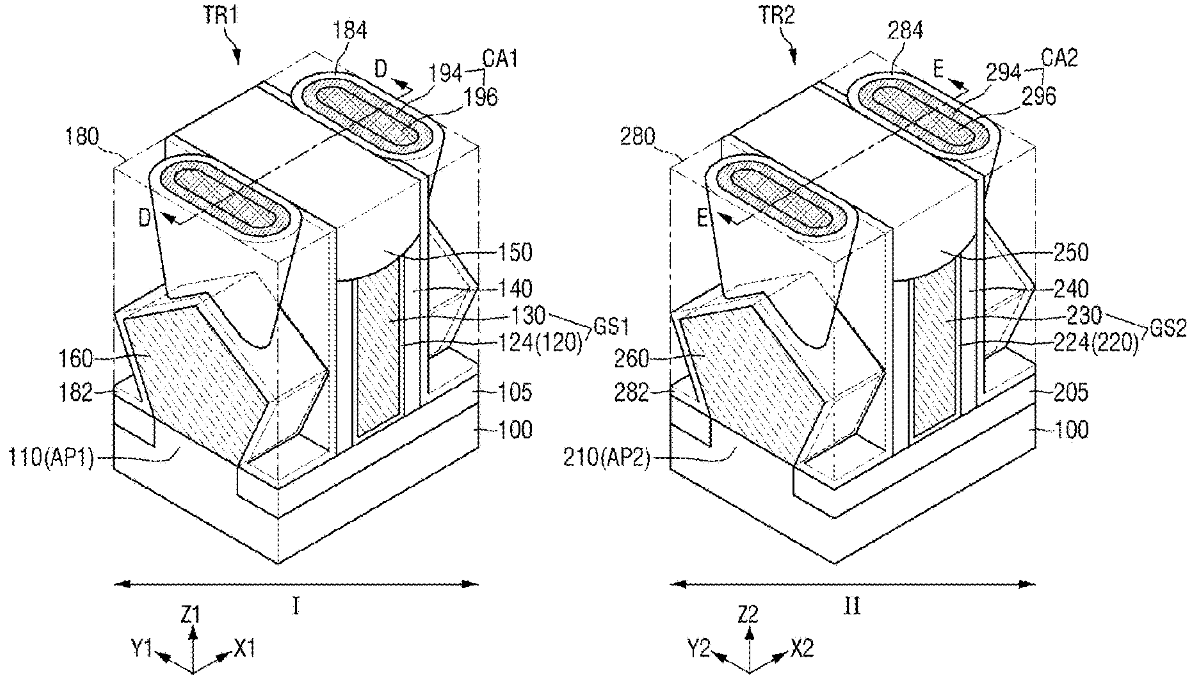
FIG. 11 is a perspective view for describing a semiconductor device according to an example embodiment.
Figure 12:
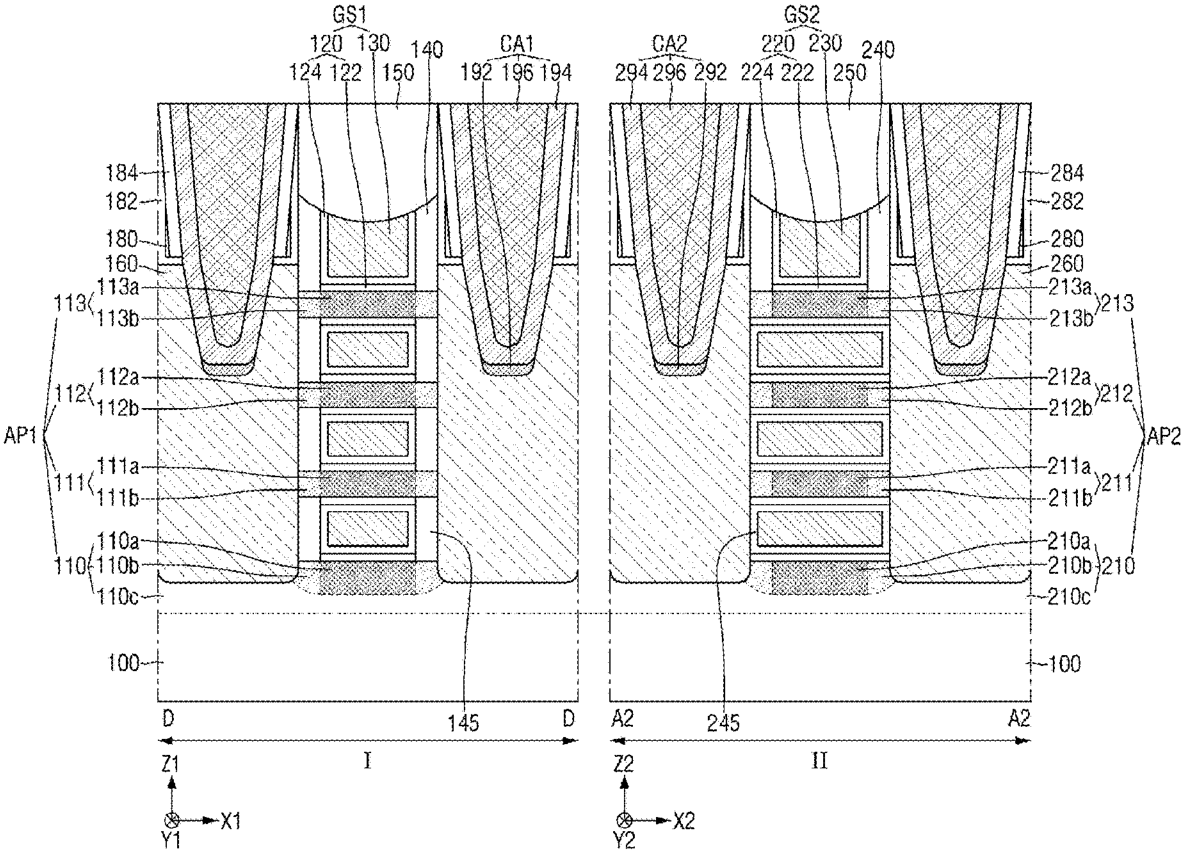
FIG. 12 is a cross-sectional view taken along lines D-D and E-E of FIG. 11.

FIG. 11 is a perspective view for describing a semiconductor device according to an example embodiment. FIG. 12 is a cross-sectional view taken along lines D-D and E-E of FIG. 11. For convenience of explanation, portions overlapping those described above with reference to FIGS. 1 to 10 will be briefly described or omitted.

Referring to FIGS. 11 and 12, in a semiconductor device according to an example embodiment, the substrate 100 includes a first area I and a second area II.

The first area I and the second area II may be areas connected to each other or areas separated from each other. A first transistor TR1 may be disposed on the first area I of the substrate 100, and a second transistor TR2 may be disposed on the second area II of the substrate 100. In an example embodiment, the first transistor TR1 and the second transistor TR2 may have different conductivity types. As an example, the first transistor TR1 may be an NFET, and the second transistor TR2 may be a PFET.

The first transistor TR1 may include a first field insulating film 105, a first active pattern AP1, a first gate structure GS1, a first gate spacer 140, a first gate capping pattern 150, a first source/drain pattern 160, a first interlayer insulating film 180, and a first source/drain contact CA1.

The second transistor TR2 may include a second field insulating film 205, a second active pattern AP2, a second gate structure GS2, a second gate spacer 240, a second gate capping pattern 250, a second source/drain pattern 260, a second interlayer insulating film 280, and a second source/drain contact CA2. Except for being formed on the second area II, because the second active pattern AP2, the second gate structure GS2, the second gate spacer 240, the second gate capping pattern 250, the second source/drain pattern 260, the second interlayer insulating film 280, and the second source/drain contact CA2 may be similar to the first field insulating film 105, the first active pattern AP1, the first gate structure GS1, the first gate spacer 140, the first gate capping pattern 150, the first source/drain pattern 160, the first interlayer insulating film 180, and the first source/drain contact CA1, respectively, a detailed description thereof will be omitted below.

The second active pattern AP2 may extend in a fourth direction X2 parallel to the upper surface of the substrate 100. In some example embodiments, the second active pattern AP2 may include a plurality of bridge patterns (e.g., fourth to sixth bridge patterns 211 to 213) that are sequentially stacked on the upper surface of the substrate 100 and are spaced apart from each other and each extend in the fourth direction X2. In some embodiments, the second active pattern AP2 may further include a second fin pattern 210. The second fin pattern 210 may protrude from the upper surface of the substrate 100 and extend in the fourth direction X2.

The second active pattern AP2 may include the two-dimensional chalcogenide in which the semiconductor element and the chalcogen element are combined. In some example embodiments, when the first transistor TR1 is an NFET and the second transistor TR2 is a PFET, the first active pattern AP1 may include the two-dimensional chalcogenide doped with a p-type impurity, and the second active pattern AP2 may include the two-dimensional chalcogenide doped with an n-type impurity.

The second gate structure GS2 may intersect the second active pattern AP2. For example, the second gate structure GS2 may extend in a fifth direction Y2 that is parallel to the upper surface of the substrate 100 and intersects the fourth direction X2. The second gate structure GS2 may include a second gate dielectric film 220 and a second gate electrode 230. In some example embodiments, the second gate dielectric film 220 may include a second interface film 222 and a second high-k dielectric film 224 sequentially stacked on the second active pattern AP2.

In some example embodiments, the second transistor TR2 may not include the internal spacer (e.g., 145 in FIG. 2).

The second active pattern AP2 may include third chalcogenization portions 210*a* to 213*a* and fourth chalcogenization portions 210*b* to 213*b*. The third chalcogenization portions 210*a* to 213*a* may overlap the second gate structure GS2, and the fourth chalcogenization portions 210*b* to 213*b* may overlap the second gate spacer 240.

The third chalcogenization portions 210*a* to 213*a* and the fourth chalcogenization portions 210*b* to 213*b* may each include the two-dimensional chalcogenide in which the semiconductor element and the chalcogen element are combined. In this case, a concentration of the chalcogen element in the fourth chalcogenization portions 210*b* to 213*b* may be lower than a concentration of the chalcogen element in the third chalcogenization portions 210*a* to 213*a*.

In some example embodiments, a third liner film 282 covering the second source/drain pattern 260 may be formed. Since the third liner film 282 may be similar to the first liner film 182, a detailed description thereof will be omitted below.

In some example embodiments, the second source/drain contact CA2 may include a second silicide film 292, a second barrier metal film 294, and a second metal film 296 sequentially stacked on the second source/drain pattern 260.

In some example embodiments, a fourth liner film 284 may be formed on the second interlayer insulating film 280 and the third liner film 282. Since the fourth liner film 284 may be similar to the second liner film 184, a detailed description thereof will be omitted below.

Figure 13:
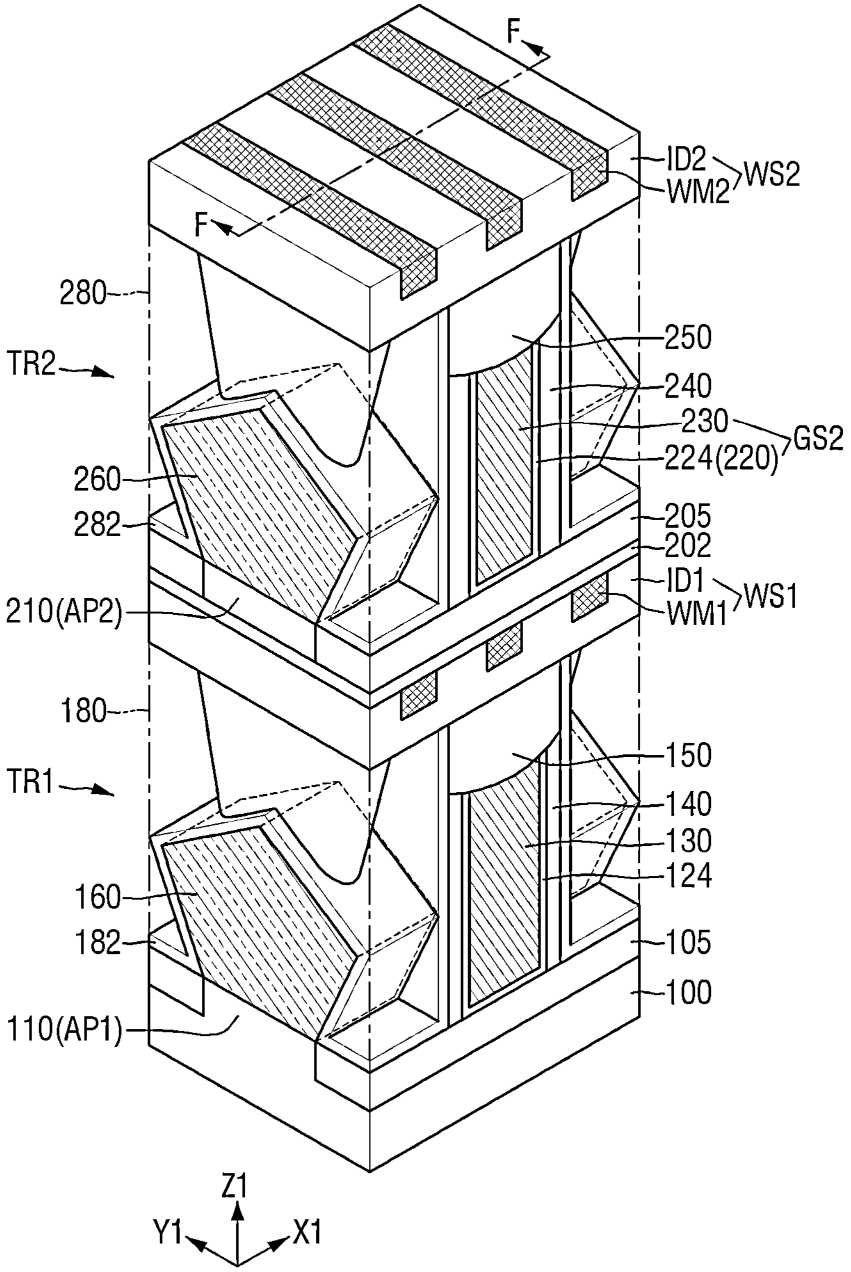
FIG. 13 is a perspective view for describing a semiconductor device according to an example embodiment.
Figure 14:
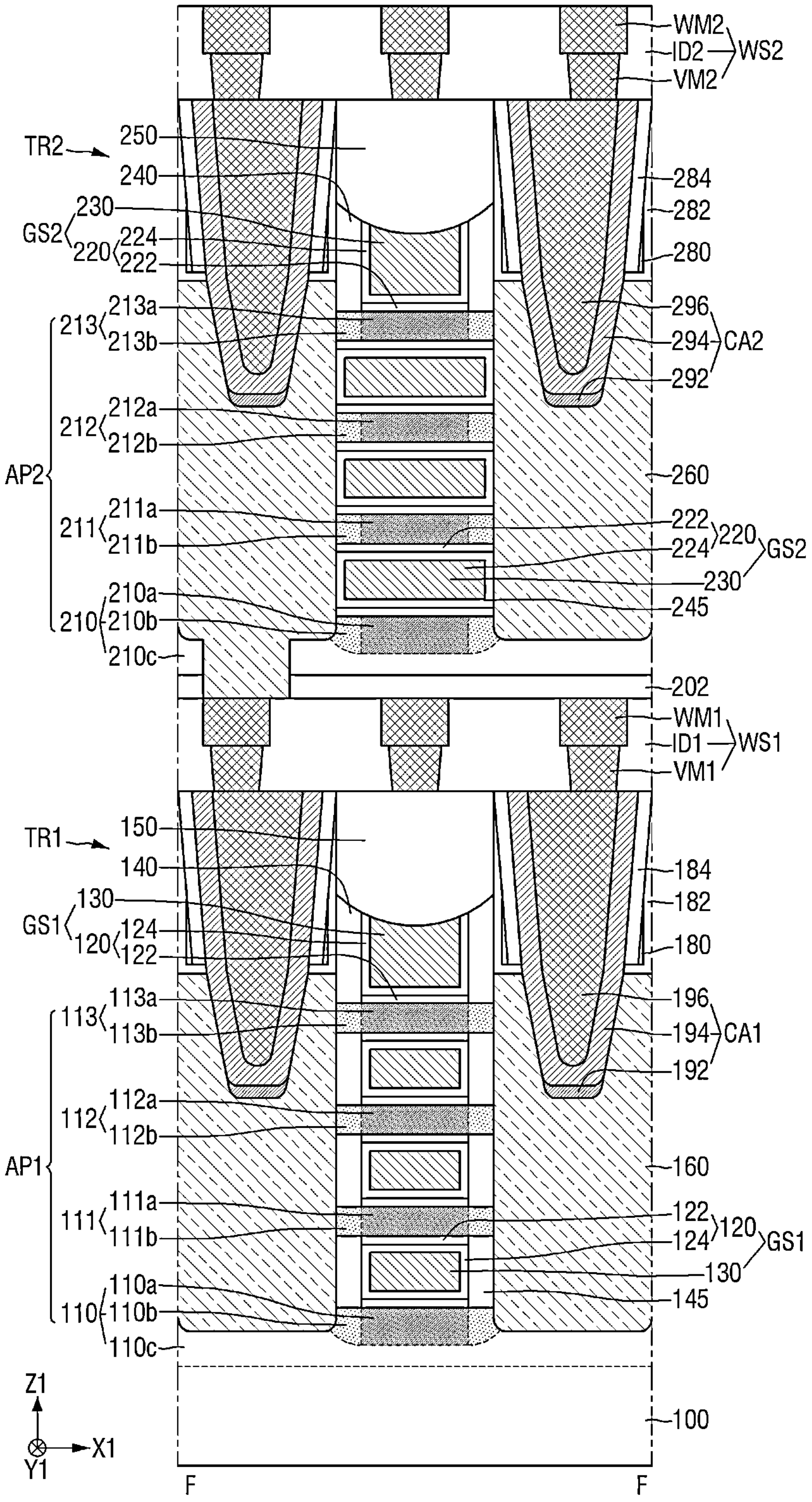
FIG. 14 is a cross-sectional view taken along line F-F of FIG. 13.

FIG. 13 is a perspective view for describing a semiconductor device according to an example embodiment. FIG. 14 is a cross-sectional view taken along line F-F of FIG. 13. For convenience of explanation, portions overlapping those described above with reference to FIGS. 1 to 12 will be briefly described or omitted.

Referring to FIGS. 13 and 14, in a semiconductor device according to an example embodiment, the second transistor TR2 is stacked on the first transistor TR1.

For example, a first wiring structure WS1 may be formed on the first transistor TR1, and a separation insulating film 202 covering the first wiring structure WS1 may be formed thereon. The second transistor TR2 may be stacked on the separation insulating film 202. The first wiring structure WS1 may be electrically connected to at least one of the first gate electrode 130 and the first source/drain contact CA1. For example, the first wiring structure WS1 may include a first inter-wiring insulating film ID1 and first wiring patterns WM1 extending in the second direction Y1 within the first inter-wiring insulating film ID1. The first wiring patterns WM1 may be electrically connected to the first gate electrode 130 and/or the first source/drain contact CA1 through first via patterns VM1 extending in the third direction Z1 within the first inter-wiring insulating film ID1.

In addition, for example, a second wiring structure WS2 may be formed on the second transistor TR2. The second wiring structure WS2 may be electrically connected to at least one of the second gate electrode 230 and the second source/drain contact CA2. For example, the second wiring structure WS2 may include a second inter-wiring insulating film ID2 and second wiring patterns WM2 extending in the second direction Y1 within the second inter-wiring insulating film ID2. The second wiring patterns WM2 may be electrically connected to the second gate electrode 230 and/or the second source/drain contact CA2 through second via patterns VM2 extending in the third direction Z1 within the second inter-wiring insulating film ID2.

However, this is only an example, and the first wiring structure WS1 and the second wiring structure WS2 may also be connected in various other forms. It is only illustrated that the second transistor TR2 is stacked on the first transistor TR1, but the first transistor TR1 may also be stacked on the second transistor TR2. In addition, other additional transistors may also be stacked on the first transistor TR1 and/or the second transistor TR2.

In some example embodiments, the first transistor TR1 and the second transistor TR2 may be electrically connected to each other. For example, the first transistor TR1 and the second transistor TR2 may form a complementary metal-oxide-semiconductor (CMOS). As an example, the first transistor TR1 and the second transistor TR2 may form an inverter connected in parallel between a power node VDD and a ground node VSS. An input of the inverter may be commonly connected to the first gate electrode 130 and the second gate electrode 230, and an output of the inverter may be commonly connected to a drain (e.g., the first source/drain contact CA1 on one side of the first gate electrode 130) of the first transistor TR1 and a drain (e.g., the second source/drain contact CA2 on one side of the second gate electrode 230) of the second transistor TR2.

In some example embodiments, the second source/drain contact CA2 may penetrate through the separation insulating film 202 and be electrically connected to the first wiring structure WS1. For example, the separation insulating film 202 may expose a portion of an upper surface of the first wiring structure WS1. A lower portion of the second source/drain contact CA2 may be connected to some of the first wiring patterns WM1 exposed by the separation insulating film 202. As a result, the first transistor TR1 and the second transistor TR2 may be electrically connected to each other. Thus, the first wiring structure WS1 may electrically connect the first source/drain contact CA1 and the second source/drain contact CA2.

Hereinafter, some methods for fabricating a semiconductor device according to example embodiments will be described with reference to FIGS. 1 to 34.

FIGS. 15 to 25 are intermediate step views for describing a method for fabricating a semiconductor device according to an example embodiment. For convenience of explanation, portions overlapping those described above with reference to FIGS. 1 to 14 will be briefly described or omitted.

Figure 15:
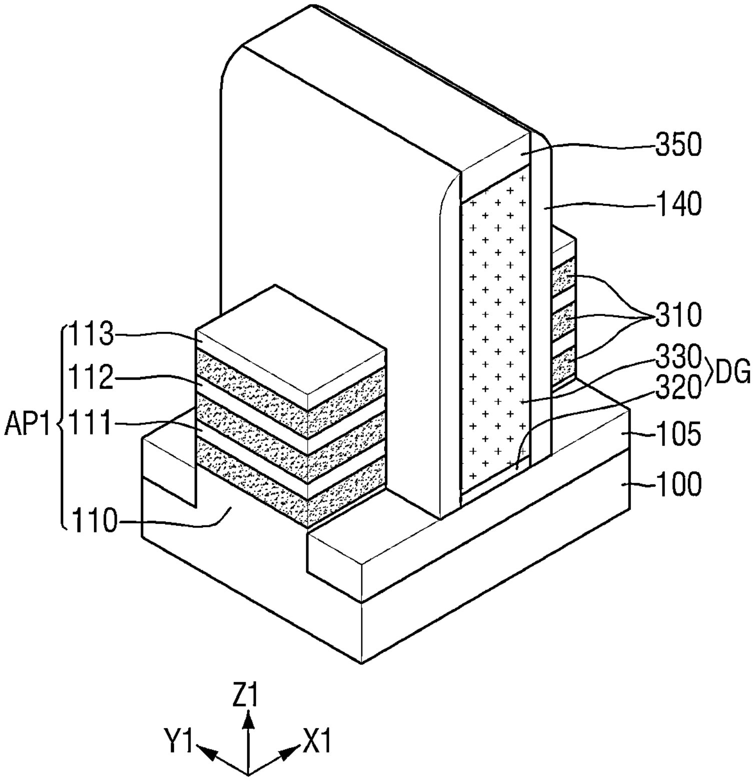
FIGS. 15 to 25 are intermediate step views for describing a method for fabricating a semiconductor device according to an example embodiment.

Referring to FIG. 15, a first active pattern AP1, a sacrificial pattern 310, a dummy gate structure DG, and a first gate spacer 140 are formed on a substrate 100.

For example, a sacrificial material layer and a semiconductor material layer may be alternately stacked on the substrate 100. Subsequently, a patterning process of patterning the sacrificial material layer and the semiconductor material layer may be performed. The patterned sacrificial material layer may form the sacrificial pattern 310, and the patterned semiconductor material layer may form first to third bridge patterns 111 to 113 alternately stacked with the sacrificial pattern 310. The first to third bridge patterns 111 to 113 and the sacrificial pattern 310 may have different etching selectivity. As an example, the first to third bridge patterns 111 to 113 may include silicon (Si), and the sacrificial pattern 310 may include silicon germanium (SiGe).

In some example embodiments, in the process of patterning the sacrificial material layer and the semiconductor material layer, a portion of the substrate 100 may be etched to form a first fin pattern 110. Through this, the first active pattern AP1 including the first fin pattern 110 and the first to third bridge patterns 111 to 113 may be formed. Subsequently, a first field insulating film 105 may be formed on the substrate 100. The first field insulating film 105 may cover at least a portion of a side surface of the first fin pattern 110.

Subsequently, the dummy gate structure DG may be formed on the first active pattern AP1 and the sacrificial pattern 310. The dummy gate structure DG may intersect the first active pattern AP1 and the sacrificial pattern 310. For example, the dummy gate structure DG may extend in the second direction Y1.

In some example embodiments, the dummy gate structure DG may include a dummy gate dielectric film 320 and a dummy gate electrode 330. For example, a dielectric film and an electrode film sequentially stacked on the substrate 100 and the first field insulating film 105 may be formed. Subsequently, a mask pattern 350 extending in the second direction Y1 may be formed on the electrode film. Subsequently, a patterning process of patterning the dielectric film and the electrode film using the mask pattern 350 as an etching mask may be performed. The patterned dielectric film may form the dummy gate dielectric film 320, and the patterned electrode film may form the dummy gate electrode 330.

The dummy gate structure DG may have an etching selectivity different from that of the first to third bridge patterns 111 to 113 and the sacrificial pattern 310. As an example, the dummy gate electrode 330 may include poly-Si.

The first gate spacer 140 may be formed to extend along a side surface of the dummy gate structure DG. The first gate spacer 140 may include, for example, at least one of silicon nitride, silicon oxynitride, silicon oxycarbide, silicon boron nitride, silicon carbonitride, silicon oxycarbonitride, and a combination thereof, but is not limited thereto.

Figure 16:
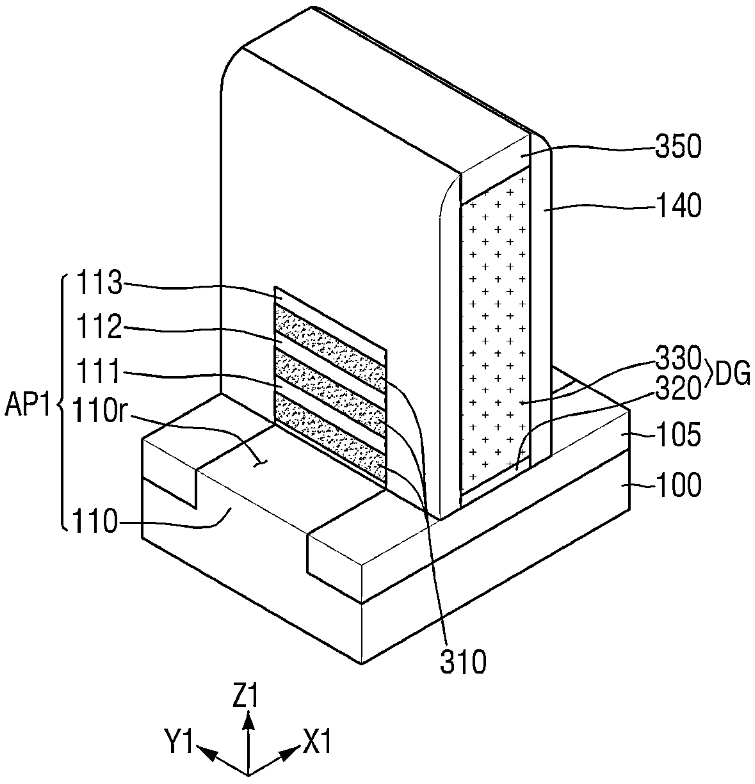

Referring to FIG. 16, a first recess process is performed on the first to third bridge patterns 111 to 113 and the sacrificial pattern 310.

As the first recess process is performed, a portion of the first to third bridge patterns 111 to 113 and a portion of the sacrificial pattern 310 disposed outside the dummy gate structure DG may be removed to form a first recess 110*r*. In some example embodiments, an upper portion of the first fin pattern 110 may be removed while the first recess 110*r* is formed.

Figure 17:
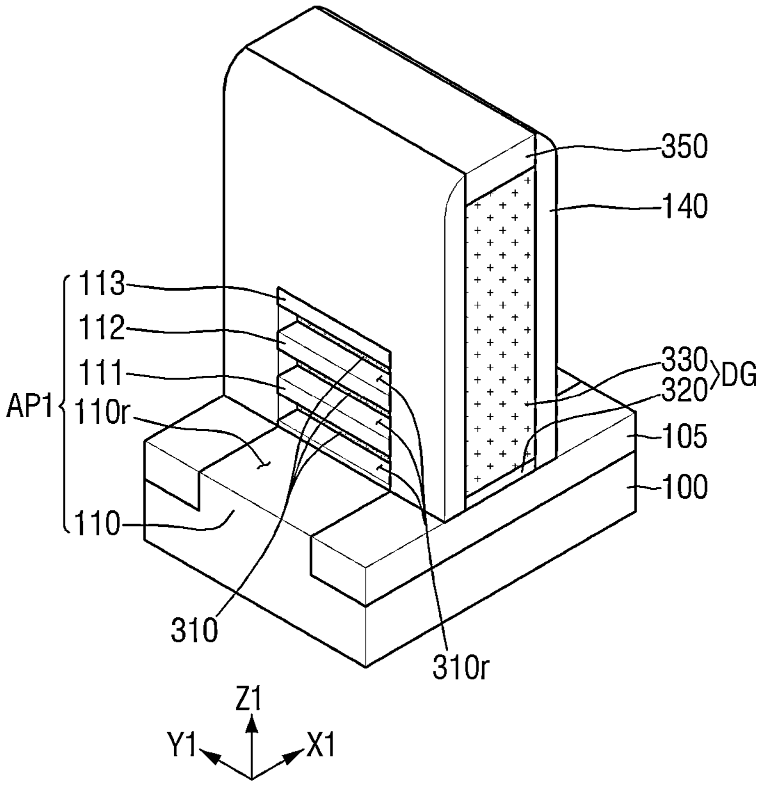

Referring to FIG. 17, a second recess process is performed on the sacrificial pattern 310.

As the second recess process is performed, a side surface of the sacrificial pattern 310 exposed by the first recess 110*r* may be recessed to form a second recess 310*r*. In addition, the first active pattern AP1 may protrude more than the sacrificial pattern 310 in the first direction X1.

Figure 18:
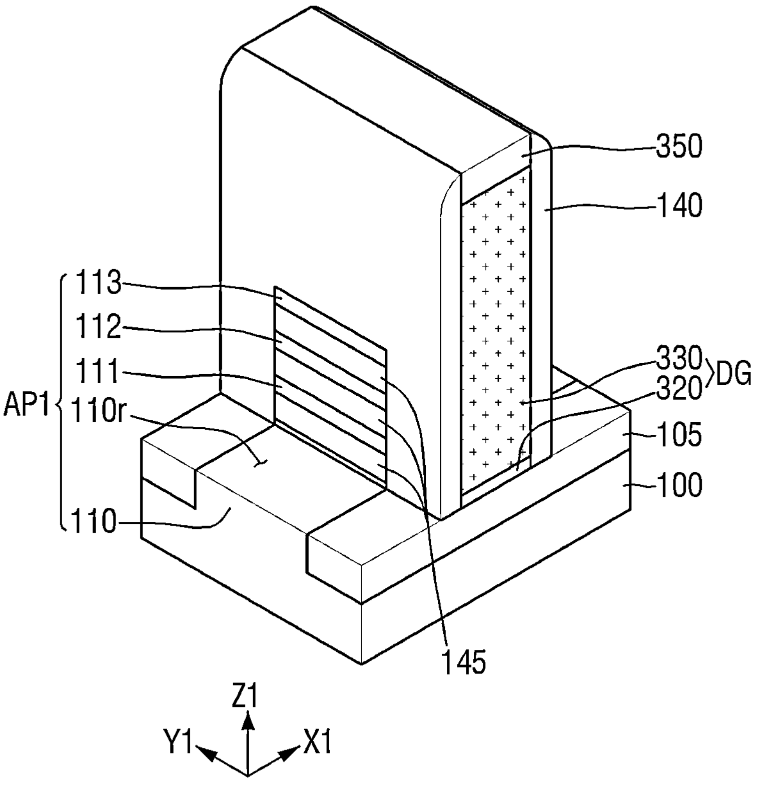

Referring to FIG. 18, an internal spacer 145 is formed on the side surface of the sacrificial patterns 310.

The internal spacer 145 may be formed to fill the second recess 310*r* of FIG. 17. For example, a spacer film conformally extending along a surface of the resultant product of FIG. 17 may be formed. Subsequently, a recess process may be performed on the spacer film. Through this, a plurality of internal spacers 145 separated from each other by the first active pattern AP1 may be formed in the first gate spacer 140.

Figure 19:
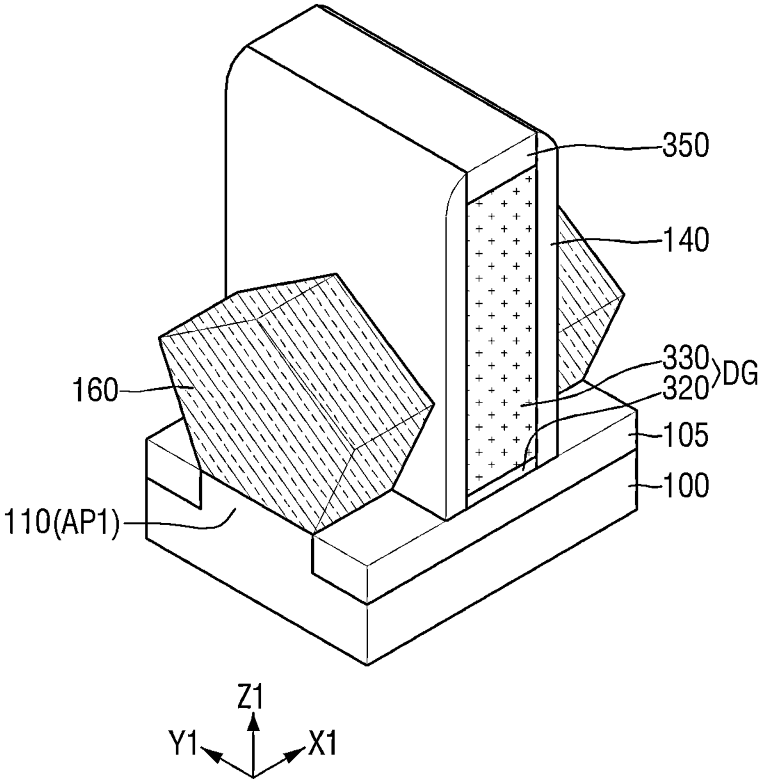

Referring to FIG. 19, a first source/drain pattern 160 is formed on the side surface of the dummy gate structure DG.

The first source/drain pattern 160 may fill the first recess 110*r* of FIG. 18. For example, the first source/drain pattern 160 may be formed by an epitaxial growth method using the first active pattern AP1 as a seed layer. Through this, the first source/drain pattern 160 connected to the first active pattern AP1 may be formed on an outer side surface of the first gate spacer 140 and an outer side surface of the internal spacer 145.

Figure 20:
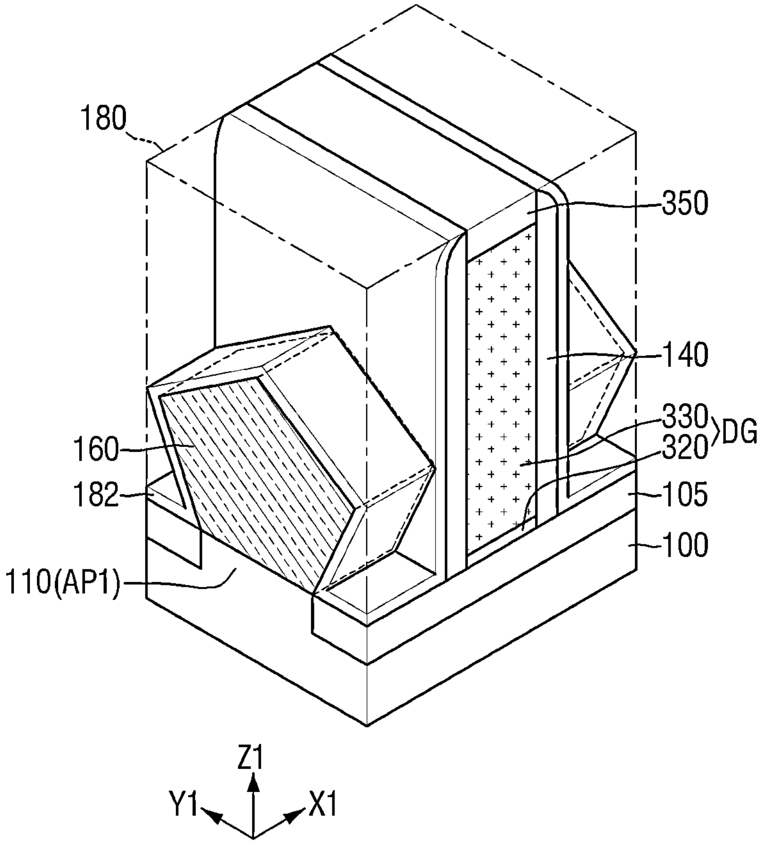

Referring to FIG. 20, a first liner film 182 and a first interlayer insulating film 180 are formed.

Figure 21:
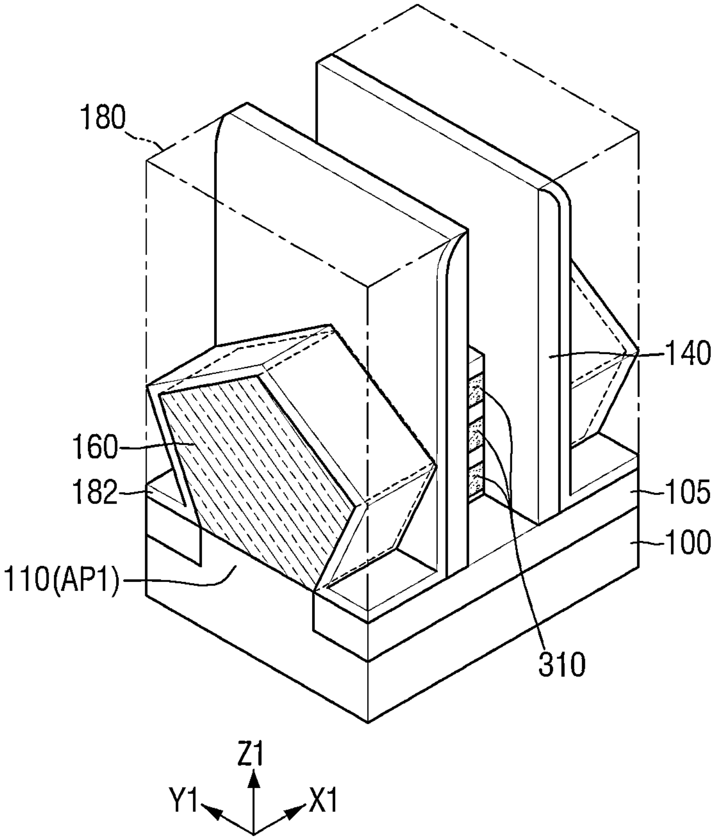

The first liner film 182 may conformally extend along a profile of the surface of the first source/drain pattern 160. The first liner film 182 may further extend along an upper surface of the first field insulating film 105 and the outer side surface of the first gate spacer 140. The first interlayer insulating film 180 may be formed on the first liner film 182. The first interlayer insulating film 180 may be formed to fill a space on an outer side of the first gate spacer 140. Referring to FIG. 21, the dummy gate structure DG is removed.

As described above, the dummy gate structure DG may have the etching selectivity different from that of the first to third bridge patterns 111 to 113 and the sacrificial pattern 310, and thus may be selectively removed. As the dummy gate structure DG is removed, the first active pattern AP1 and the sacrificial pattern 310 disposed inside the first gate spacer 140 may be exposed.

Figure 22:
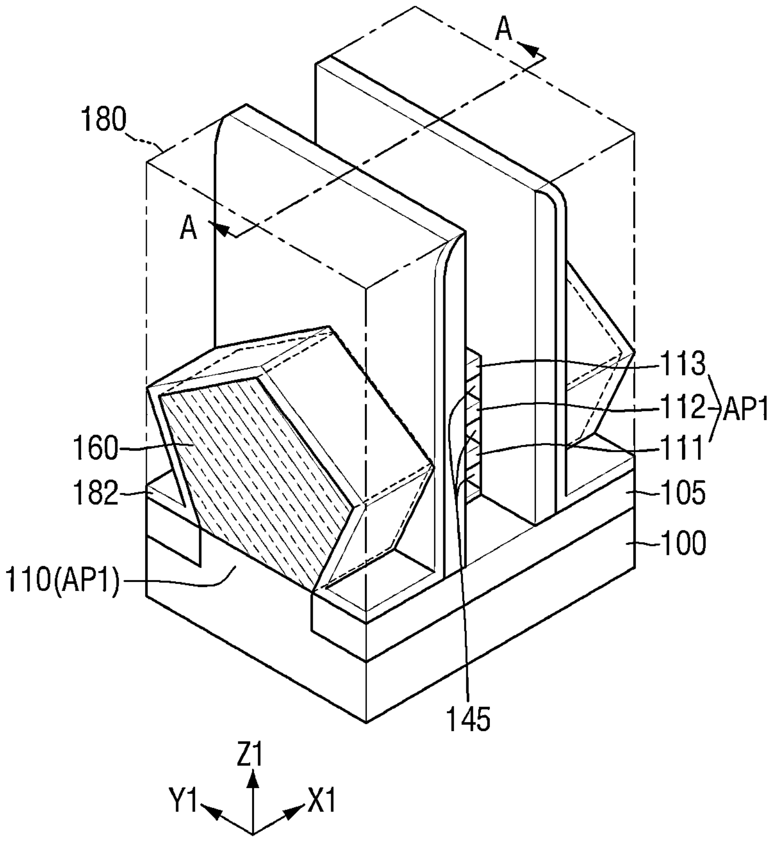
Figure 23:
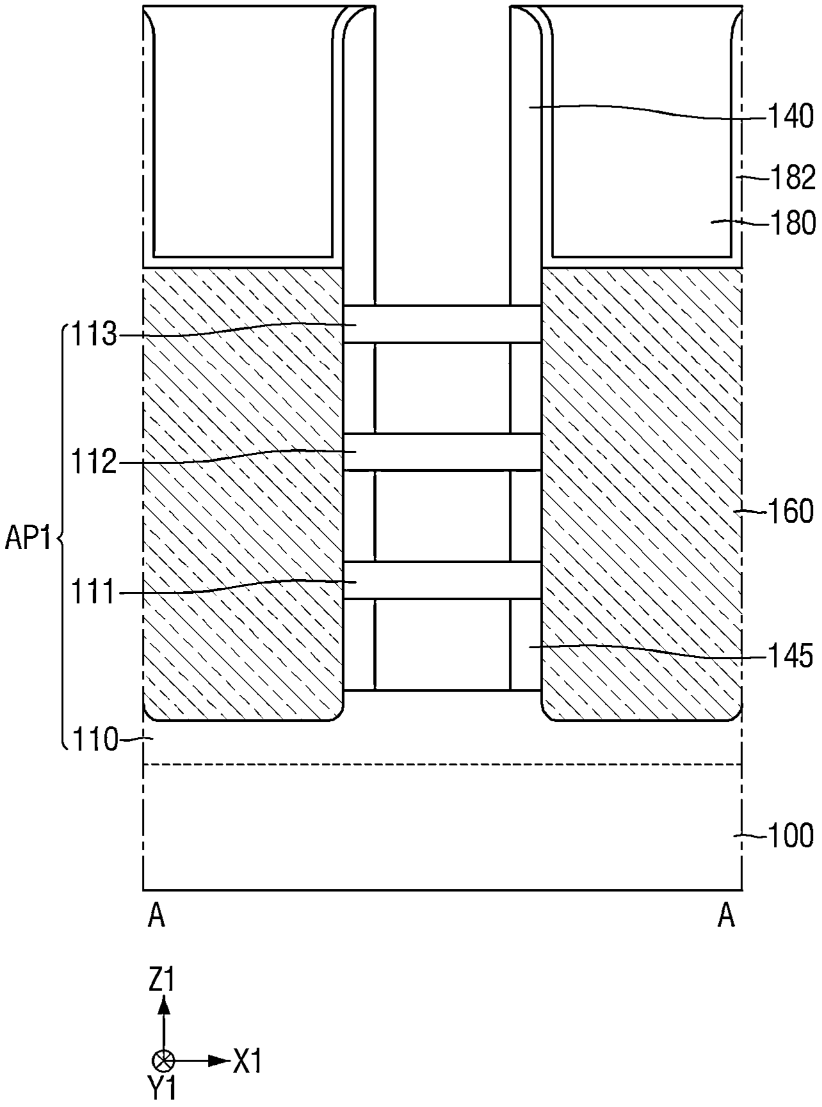

Referring to FIGS. 22 and 23, the sacrificial pattern 310 is removed. For reference, FIG. 23 is a cross-sectional view taken along line A-A of FIG. 22.

As described above, the sacrificial pattern 310 may have the etching selectivity different from that of the first to third bridge patterns 111 to 113, and thus may be selectively removed. As the sacrificial pattern 310 is removed, the first to third bridge patterns 111 to 113 spaced apart from each other may be formed on the substrate 100.

Figure 24:
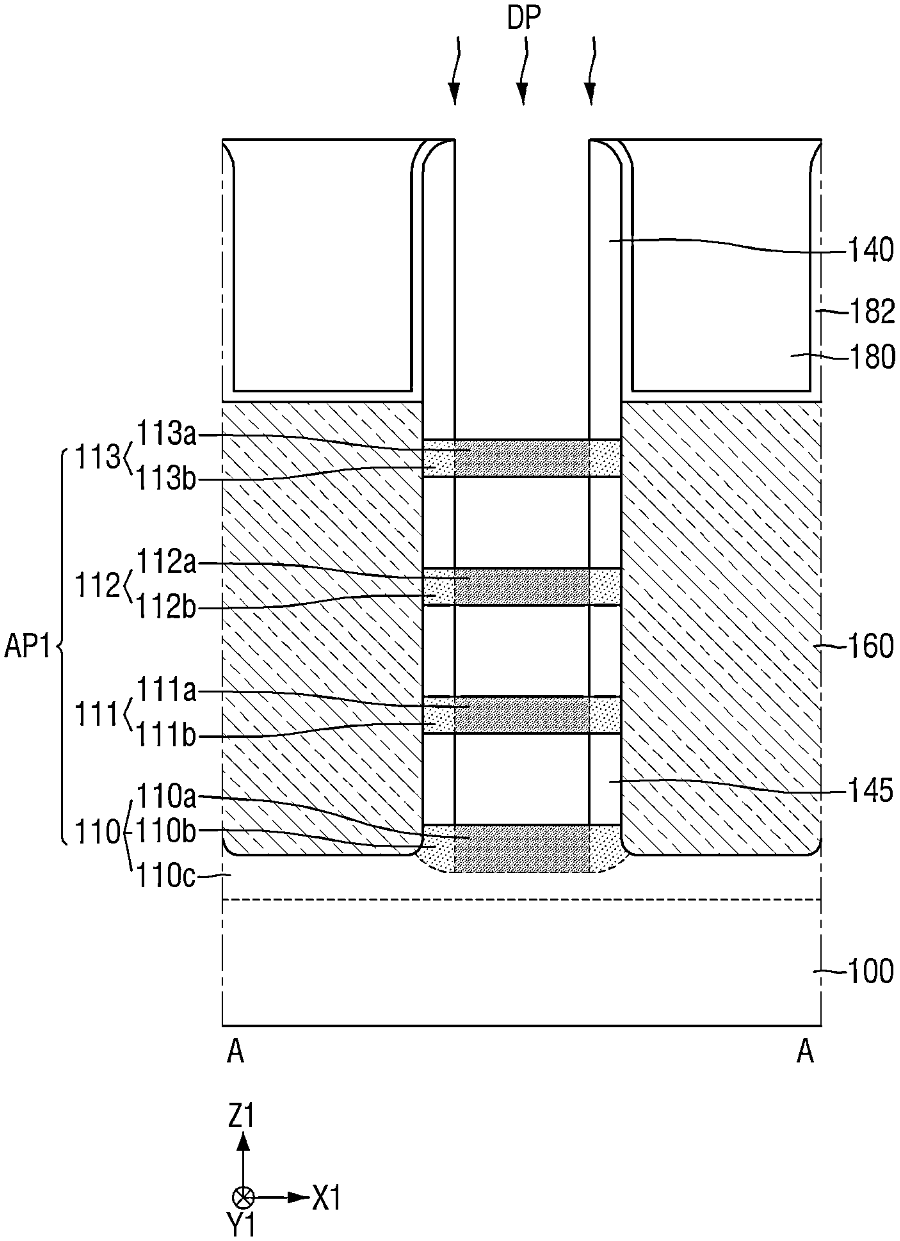

Referring to FIG. 24, a doping process DP of implanting a chalcogen element into the first active pattern AP1 is performed.

The chalcogen element may include at least one of oxygen (O), sulfur (S), selenium (Se), tellurium (Te), polonium (Po), and livermorium (Lv). In some example embodiments, the chalcogen element may be one or more elements selected from the group consisting of sulfur (S), selenium (Se), and tellurium (Te).

As the chalcogen element is implanted into the first active pattern AP1 including a semiconductor material layer, the first active pattern AP1 including the two-dimensional chalcogenide in which the semiconductor element and the chalcogen element are combined may be formed. For example, the first active pattern AP1 may include first chalcogenization portions 110*a* to 113*a* and second chalcogenization portions 110*b* to 113*b*.

The first chalcogenization portions 110*a* to 113*a* may be formed by implanting the chalcogen element into areas of the first active pattern AP1 exposed as the dummy gate structure DG and the sacrificial pattern 310 are removed. The second chalcogenization portions 110*b* to 113*b* may be formed by diffusing the chalcogen element implanted into the first chalcogenization portions 110*a* to 113*a* into an adjacent area of the first active pattern AP1. Accordingly, a concentration of the chalcogen element in the second chalcogenization portions 110*b* to 113*b* may be lower than a concentration of the chalcogen element in the first chalcogenization portions 110*a* to 113*a*. In some example embodiments, the concentration of the chalcogen element in the second chalcogenization portions 110*b* to 113*b* may decrease as a distance from the first chalcogenization portions 110*a* to 113*a* increases.

In some example embodiments, the two-dimensional chalcogenide may include a compound represented by Chemical Formula $A_2B_3$. In Chemical Formula $A_2B_3$, A represents one or more semiconductor elements selected from the group consisting of silicon (Si) and germanium (Ge). In addition, in Chemical Formula $A_2B_3$, B represents one or more chalcogen elements selected from the group consisting of sulfur (S), selenium (Se), and tellurium (Te).

In some example embodiments, the doping process DP may include an ion implantation process. For example, an ion implantation process of implanting tellurium (Te) ions into the first active pattern AP1 including silicon (Si) may be performed. Tellurium (Te) ions may be implanted at a concentration of, for example, about $1E15/cm^2$ to about $1E16/cm^2$, but is not limited thereto. Subsequently, an annealing process may be performed on the first active pattern AP1. The annealing process may be performed at a temperature of, for example, about 400° C. to about 700° C., but is not limited thereto. Through this, the first active pattern AP1 including silicon telluride ($Si_2Te_3$) may be formed.

In some example embodiments, the doping process DP may include a plasma doping process. As an example, a plasma doping process of implanting tellurium (Te) ions into the first active pattern AP1 including silicon (Si) using plasma containing tellurium (Te) may be performed. The plasma may be generated using, for example, a tellurium (Te) precursor and/or a carrier gas (e.g., Ar gas). The tellurium precursor may include, for example, at least one of $TeF_4$, $TeCl_4$, $TeBr_4$, $TeI_4$, $TeO_2$, $TeS_2$, $TeSe_2$, $TeH_4$, $TeHF_3$, $TeH_3F$, $TeH_2F_2$, and a combination thereof, but is not limited thereto. Tellurium (Te) ions may be implanted at a concentration of, for example, about 5E15/cm$^2$ to about 5E16/cm$^2$, but is not limited thereto. Subsequently, an annealing process may be performed on the first active pattern AP1. The annealing process may be performed at a temperature of, for example, about 400° C. to about 700° C., but is not limited thereto. Through this, the first active pattern AP1 including silicon telluride ($Si_2Te_3$) may be formed.

In some example embodiments, the doping process DP may further include doping an impurity element into the first active pattern AP1. For example, the chalcogen element and the impurity element may be co-doped into the first active pattern AP1. The impurity element may include, for example, at least one of a p-type impurity such as B, $BF_3$, $BH_3$, Ga or In, an n-type impurity such as P, N, As, Sb, Bi or F, an intrinsic impurity such as C, Ge or Sn, and a combination thereof, but is not limited thereto.

Figure 25:
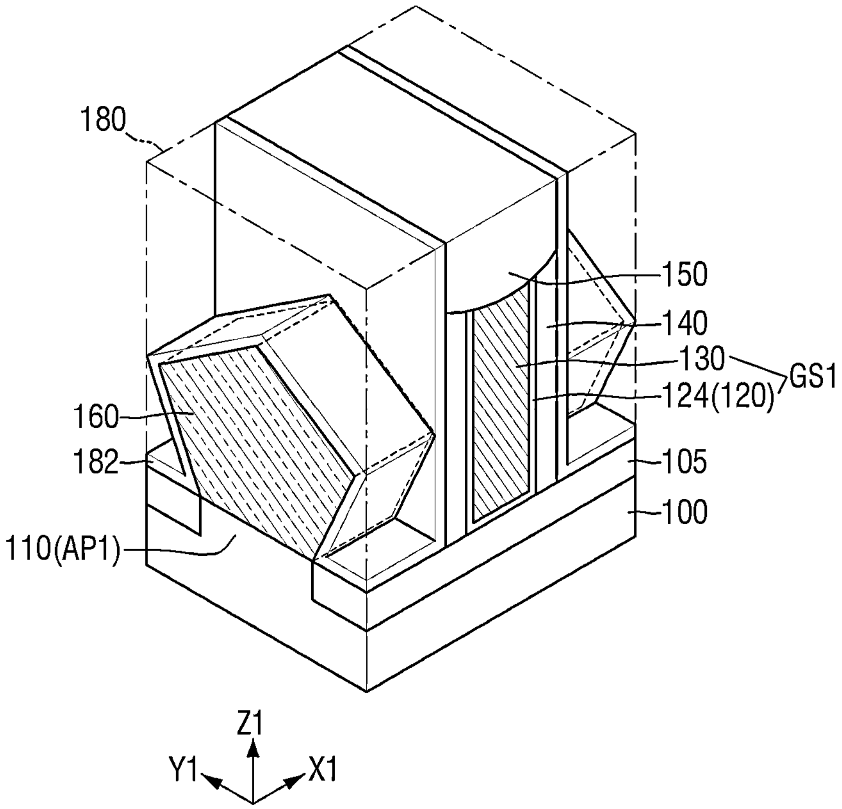

Referring to FIG. 25, a first gate structure GS1 is formed. For example, the first gate dielectric film 120 and the first gate electrode 130 may be sequentially stacked on the first active pattern AP1. Through this, the first gate structure GS1 intersecting the first active pattern AP1 may be formed in the area where the dummy gate structure DG and the sacrificial pattern 310 are removed. Subsequently, a first gate capping pattern 150 extending along an upper surface of the first gate structure GS1 may be formed. In some example embodiments, the first gate capping pattern 150 may be formed after performing an etch-back process on the first gate structure GS1.

Subsequently, referring to FIG. 1, a first source/drain contact CA1 connected to the first source/drain pattern 160 is formed. Through this, the semiconductor device described above with reference to FIGS. 1 to 6 may be fabricated.

Figure 26:
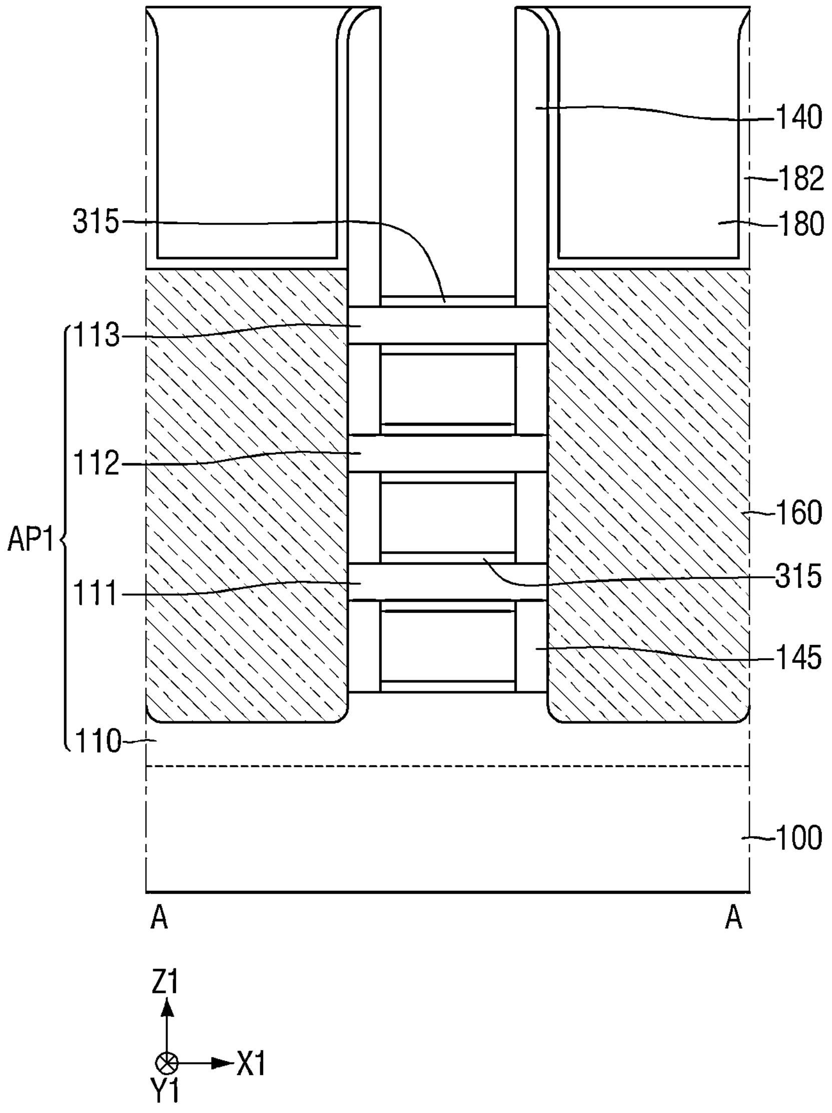
FIGS. 26 to 27 are intermediate step views for describing a method for fabricating a semiconductor device according to an example embodiment.
Figure 27:
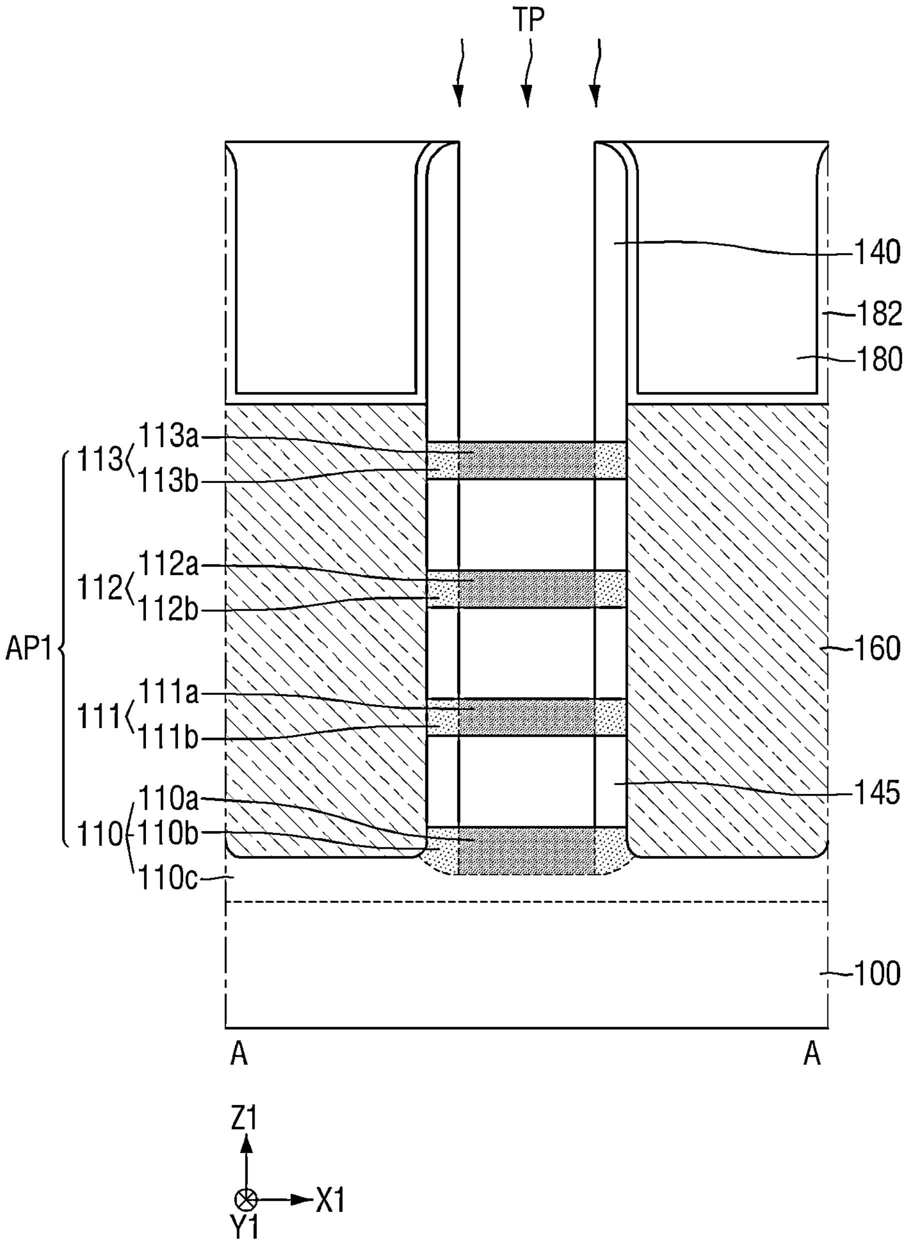

FIGS. 26 to 27 are intermediate step views for describing a method for fabricating a semiconductor device according to an example embodiment. For convenience of explanation, portions overlapping those described above with reference to FIGS. 1 to 25 will be briefly described or omitted. For reference, FIG. 26 is an intermediate step view for describing steps after FIG. 23.

Referring to FIG. 26, a chalcogen material layer 315 is formed on the first active pattern AP1.

The chalcogen material layer 315 may include the chalcogen element. The chalcogen material layer 315 may be formed by, for example, an atomic layer deposition (ALD) process or a chemical vapor deposition (CVD) process, but is not limited thereto. As an example, the chalcogen material layer 315 including tellurium (Te) may be formed using a tellurium (Te) precursor. The tellurium precursor may include, for example, at least one of Te(GeMe); Te(GeEt); Te(GeiPr); Te(GetBu): Te(GetBuMe); Te(SiMe); Te(SiEt); Te(SiiPr); Te(SitBu): Te(SitBuMe); Te(Ge(SiMe)); Te(Si(SiMe)); Te(GeMe)(Si(SiMe)), Te(Ge(SiMe)); ((GeMe)Te—); ((GeEt)Te); (GeMeEt)Te); ((GeiPr—)Te—); ((SiMe)Te—); ((SiEt)Te—); ((SiMeEt)Te); ((SiiPr)Te) ((GeMe), Te(GeMe)Te—); ((GeMe)Te—); (($SiMe_2$)Te—); CHCH GeMe TeGeMe: SiMeSiMe,GeMe TeGeMe: Te(GeNtBu-CHCHNtEu); Te(GeNtBuCH═CHNtBu); Te((GeNtBuCH(CH,)CH (CH)NtBu); Te(SiNtEuCHCH-NtBu); Te(SiN-tEuCH-CHNtBu); and Te((SiNtEuCH(CH) CH(CH)NtBu), but is not limited thereto.

Referring to FIG. 27, a heat treatment process TP is performed.

As the heat treatment process TP is performed, the chalcogen element of the chalcogen material layer 315 may diffuse into the first active pattern AP1. Through this, the chalcogen element may be implanted into the first active pattern AP1 to form the first active pattern AP1 including the two-dimensional chalcogenide. For example, the first active pattern AP1 may include first chalcogenization portions **110*a* to 113*a* and second chalcogenization portions 110*b* to 113*b***.

Subsequently, the steps described above with reference to FIGS. 25 and 1 may be performed. Through this, the semiconductor device described above with reference to FIGS. 1 to 6 may be fabricated.

Figure 28:
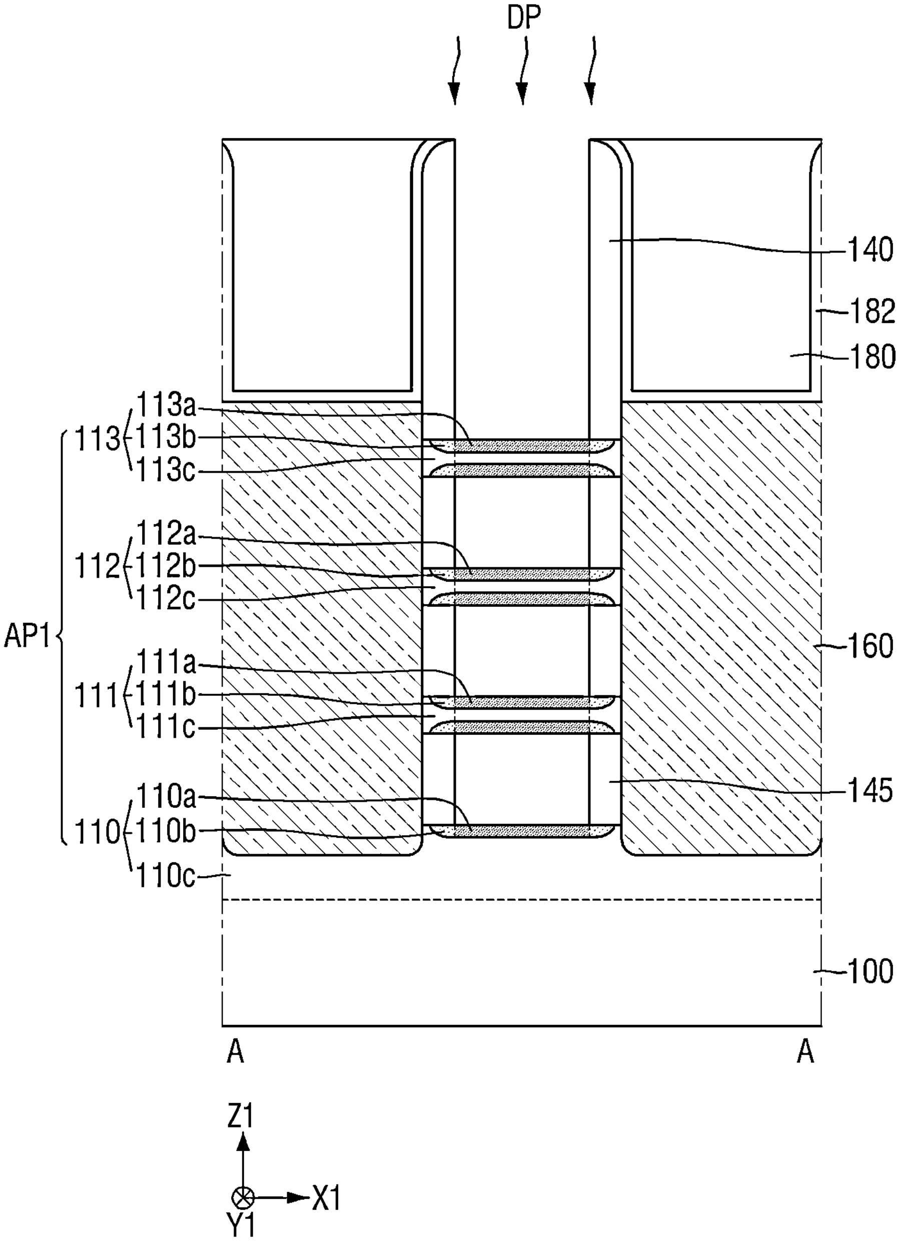
FIG. 28 is an intermediate step view for describing a method for fabricating a semiconductor device according to an example embodiment.

FIG. 28 is an intermediate step view for describing a method for fabricating a semiconductor device according to an example embodiment. For convenience of explanation, portions overlapping those described above with reference to FIGS. 1 to 25 will be briefly described or omitted. For reference, FIG. 28 is an intermediate step view for describing steps after FIG. 23.

Referring to FIG. 28, a doping process DP of implanting a chalcogen element into a portion of the first active pattern AP1 is performed.

As the chalcogen element is implanted into a portion of the first active pattern AP1 including the semiconductor material layer, a portion of the first active pattern AP1 may include the two-dimensional chalcogenide, and another portion of the first active pattern AP1 may not include the two-dimensional chalcogenide. For example, the first active pattern AP1 may include first chalcogenization portions **110*a* to 113*a*, second chalcogenization portions 110*b* to 113*b*, and base portions 110*c* to 113*c*. The base portions 110*c* to 113*c*** may include the semiconductor element (e.g., silicon (Si)) and may not include the chalcogen element (e.g., tellurium (Te)).

Subsequently, the steps described above with reference to FIGS. 25 and 1 may be performed. Through this, the semiconductor device described above with reference to FIG. 7 may be fabricated.

Figure 29:
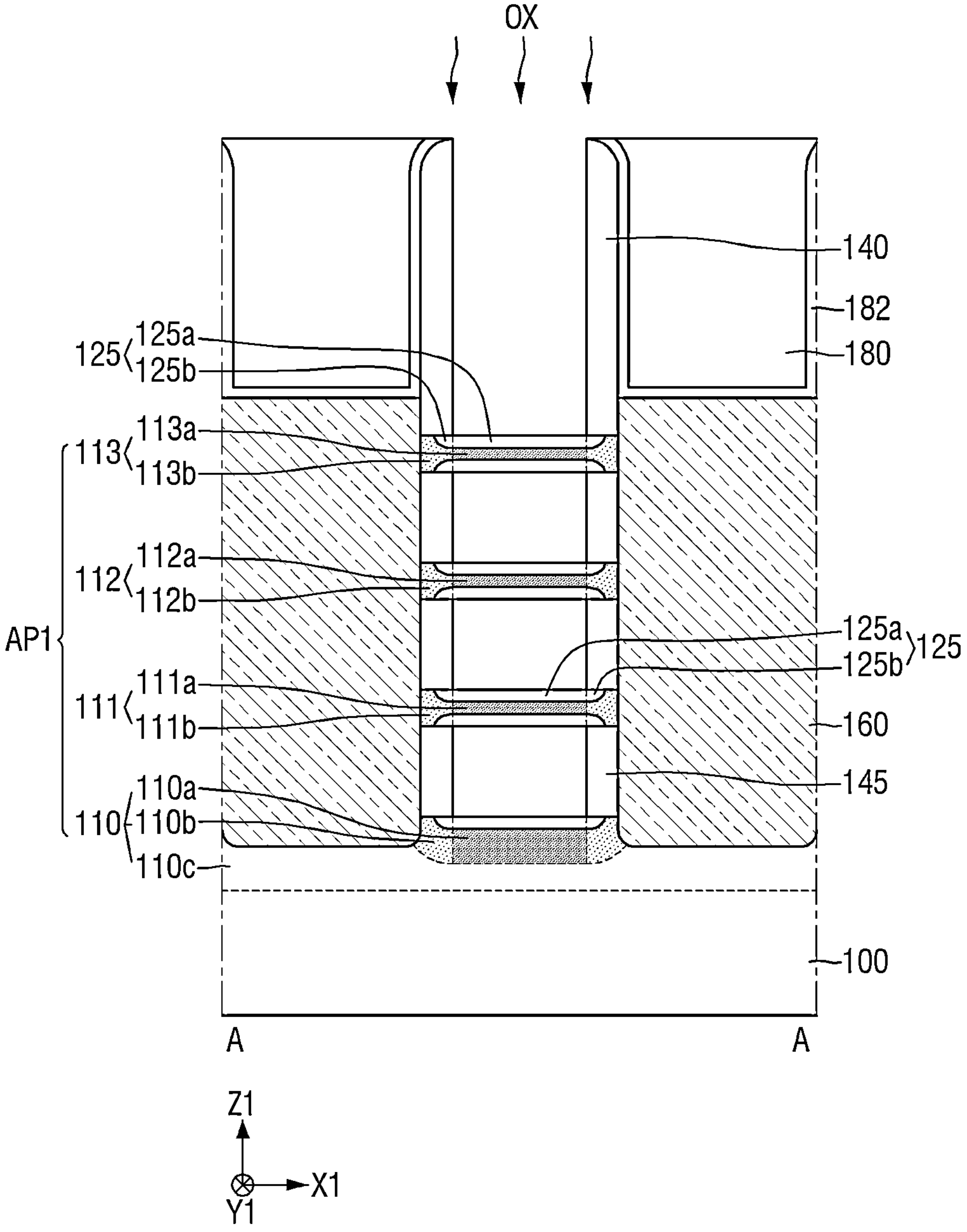
FIG. 29 is an intermediate step view for describing a method for fabricating a semiconductor device according to an example embodiment.

FIG. 29 is an intermediate step view for describing a method for fabricating a semiconductor device according to an example embodiment. For convenience of explanation, portions overlapping those described above with reference to FIGS. 1 to 25 will be briefly described or omitted. For reference, FIG. 29 is an intermediate step view for describing steps after FIG. 24.

Referring to FIG. 29, an oxidation process OX is performed on the first active pattern AP1.

As the oxidation process OX is performed, an oxide film 125 may be formed by oxidizing a portion of the first active pattern AP1 including the two-dimensional chalcogenide. For example, the oxide film 125 may include an oxide of the semiconductor element and an oxide of the chalcogen element. As an example, the two-dimensional chalcogenide may be silicon telluride ($Si_2Te_3$), and the oxide film 125 may include silicon oxide ($SiO_2$) and β-tellurium oxide (β-$TeO_2$).

In some example embodiments, the oxide film 125 may include a first oxidizing portion **125*a* and a second oxidizing portion 125***b*. The first oxidizing portion 125*a* may be formed by oxidizing a portion of the first chalcogenization portions 110*a* to 113*a*, and the second oxidizing portion 125*b* may be formed by oxidizing a portion of the second chalcogenization portions 110*b* to 113*b*. Accordingly, the concentration of the chalcogen element in the second oxidizing portion 125*b* may be lower than the concentration of the chalcogen element in the first oxidizing portion 125*a*.

Subsequently, the steps described above with reference to FIGS. 25 and 1 may be performed. Through this, the semiconductor device described above with reference to FIG. 8 may be fabricated.

Figure 30:
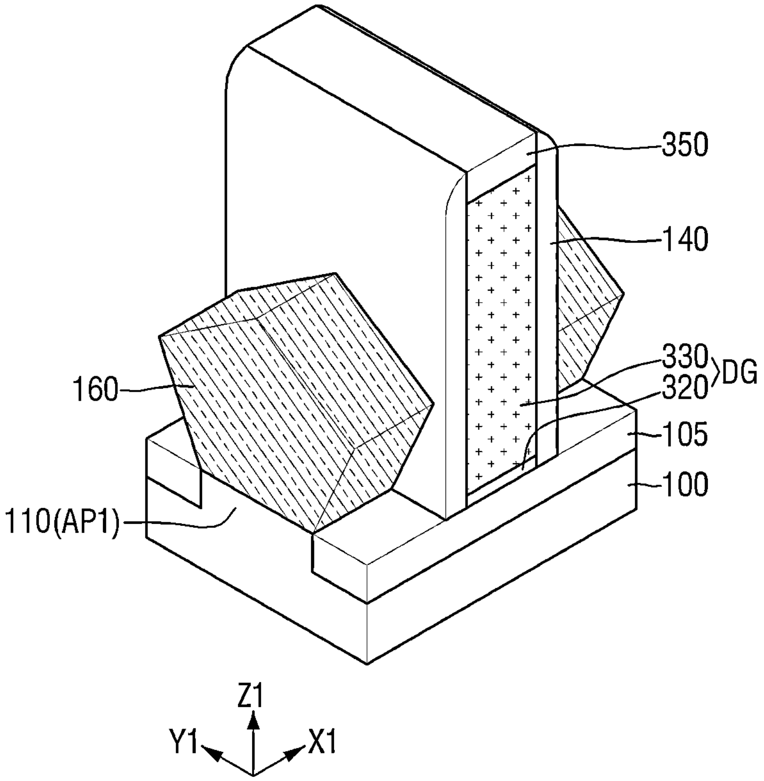
FIGS. 30 to 33 are intermediate step views for describing a method for fabricating a semiconductor device according to an example embodiment.

FIGS. 30 to 33 are intermediate step views for describing a method for fabricating a semiconductor device according to an example embodiment. For convenience of explanation, portions overlapping those described above with reference to FIGS. 1 to 25 will be briefly described or omitted. For reference, FIG. 30 is an intermediate step view for describing steps after FIG. 16.

Referring to FIG. 30, a first source/drain pattern 160 is formed on the side surface of the dummy gate structure DG.

The first source/drain pattern 160 may fill the first recess 110*r* of FIG. 16. For example, the first source/drain pattern 160 may be formed by an epitaxial growth method using the first active pattern AP1 as a seed layer. Through this, the first source/drain pattern 160 connected to the first active pattern AP1 may be formed on an outer side surface of the first gate spacer 140 and a side surface of the sacrificial pattern 310.

Figure 31:
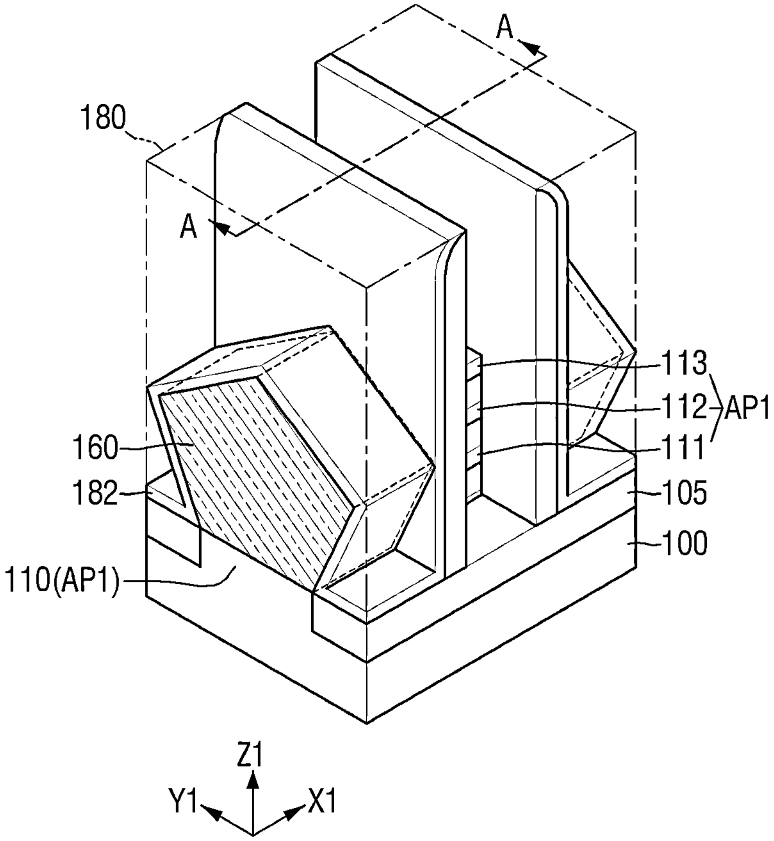
Figure 32:
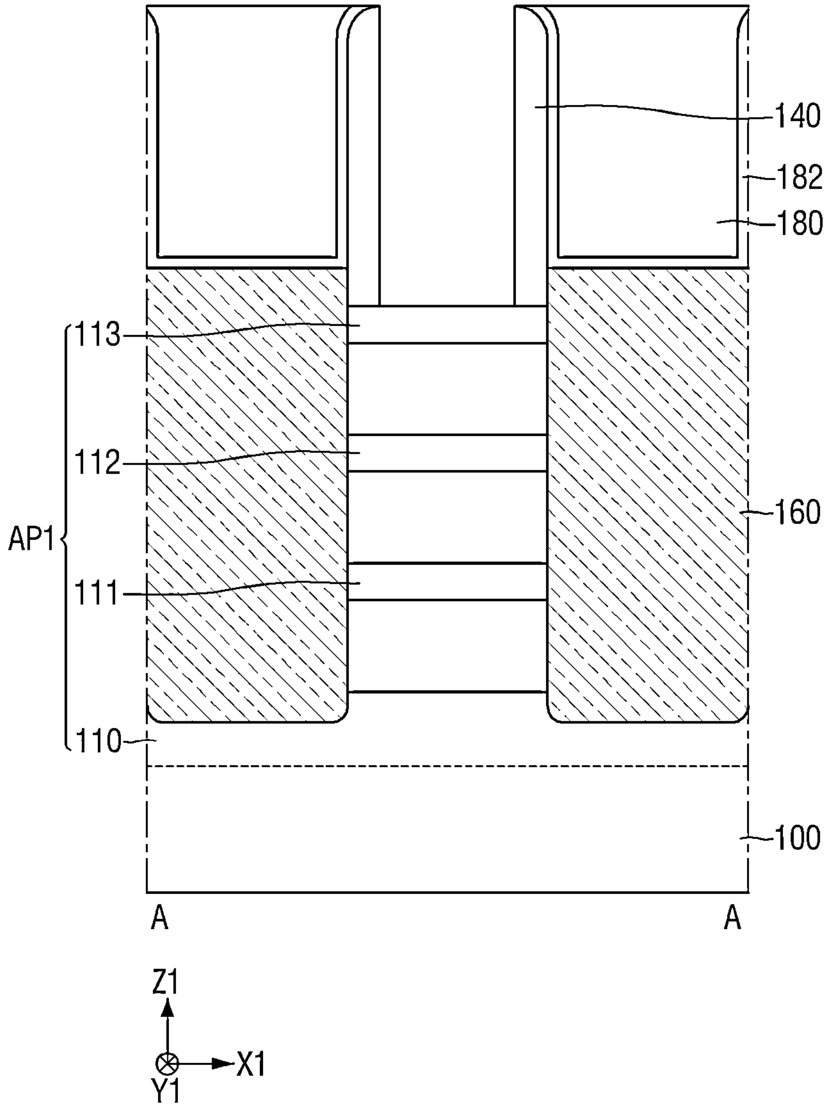

Subsequently, the steps described above with reference to FIGS. 20 to 23 may be performed. Through this, as illustrated in FIGS. 31 and 32, the first to third bridge patterns 111 to 113 spaced apart from each other may be formed on the substrate 100.

Figure 33:
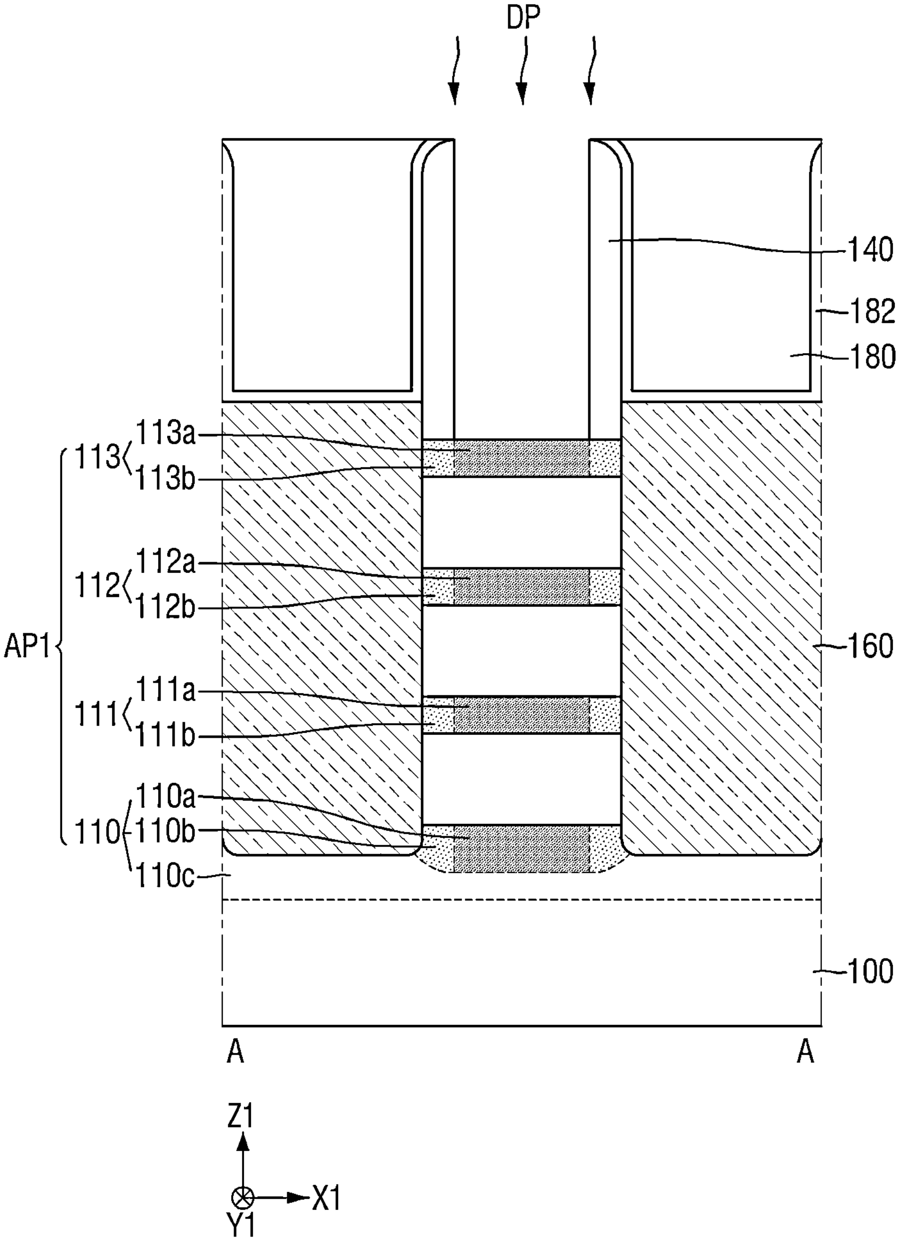

Referring to FIG. 33, a doping process DP of implanting a chalcogen element into the first active pattern AP1 is performed. Because the doping process DP is similar to that described above with reference to FIG. 24, a detailed description thereof will be omitted below.

Subsequently, the steps described above with reference to FIGS. 25 and 1 may be performed. Through this, the semiconductor device described above with reference to FIG. 9 may be fabricated.

Figure 34:
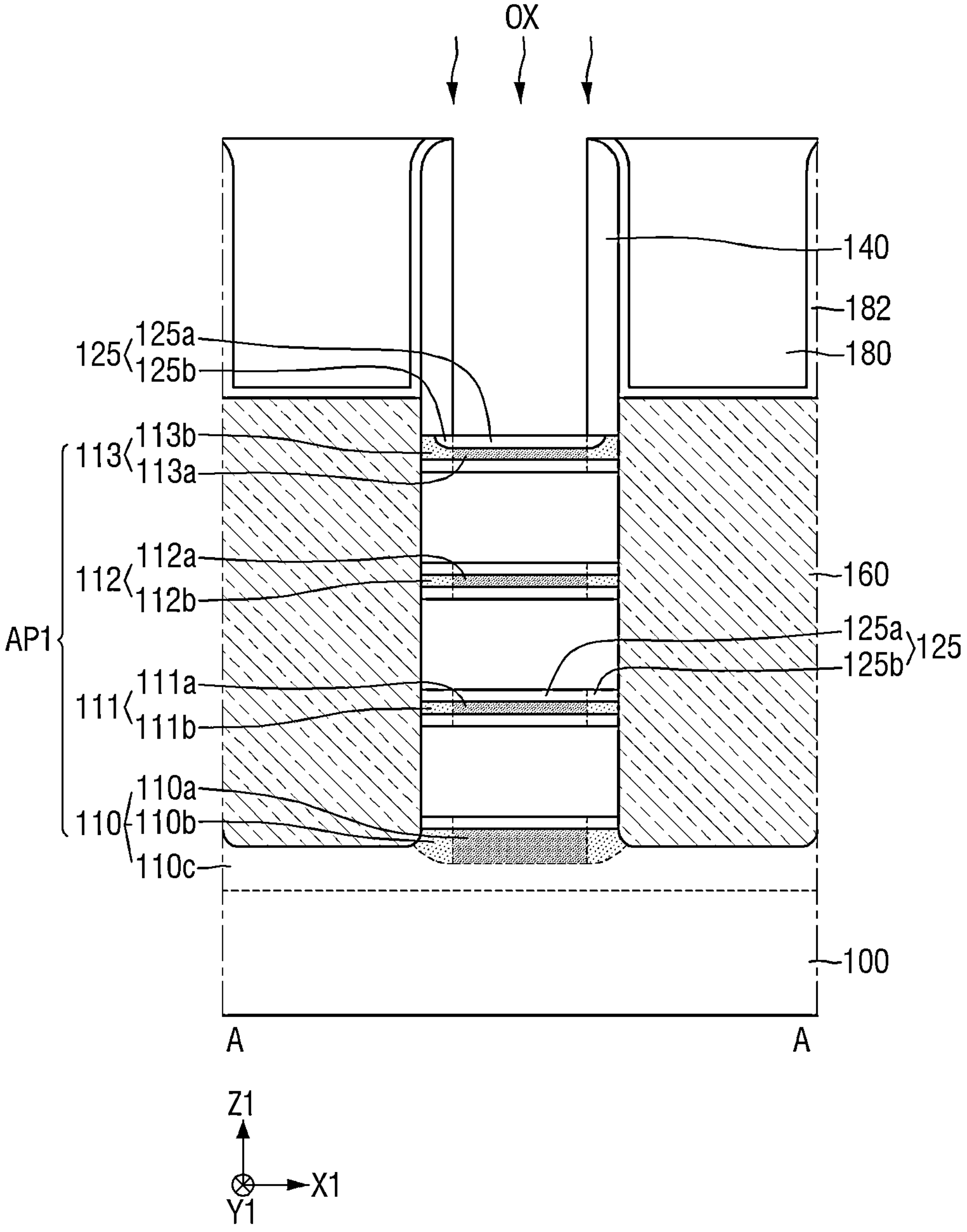
FIG. 34 is an intermediate step view for describing a method for fabricating a semiconductor device according to an example embodiment.

FIG. 34 is an intermediate step view for describing a method for fabricating a semiconductor device according to an example embodiment. For convenience of explanation, portions overlapping those described above with reference to FIGS. 1 to 33 will be briefly described or omitted. For reference, FIG. 34 is an intermediate step view for describing steps after FIG. 33.

Referring to FIG. 34, an oxidation process OX is performed on the first active pattern AP1. Since the oxidation process OX is similar to that described above with reference to FIG. 29, a detailed description thereof will be omitted below.

Subsequently, the steps described above with reference to FIGS. 25 and 1 may be performed. Through this, the semiconductor device described above with reference to FIG. 10 may be fabricated.

Meanwhile, as a method for improving performance of a semiconductor device by improving mobility and short channel effect (SCE), a semiconductor device using a two-dimensional semiconductor material as a channel is being studied. However, due to its material characteristics, the two-dimensional semiconductor material has a problem of poor compatibility with commercially available structures and processes based on silicon (Si).

However, as described above, in the semiconductor device and the method for fabricating the same according to some example embodiments, the first active pattern AP1 including the two-dimensional chalcogenide may be formed by implanting the chalcogen element into the semiconductor material layer (e.g., a silicon layer). The first active pattern AP1 may be simply implemented and has high compatibility with commercially available structures and processes. Through this, it is possible to provide a semiconductor device with improved performance using a two-dimensional semiconductor material and a method for fabricating the same.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A semiconductor device comprising:

a substrate;

a first bridge pattern spaced apart from the substrate and extending in a first direction, the first bridge pattern including a two-dimensional chalcogenide in which a semiconductor element and a chalcogen element are combined;

a gate structure extending in a second direction intersecting the first direction on the substrate, the first bridge pattern penetrating through the gate structure;

a gate spacer extending along a side surface of the gate structure, the first bridge pattern penetrating the gate spacer; and a source/drain pattern connected to the first bridge pattern on a side surface of the gate spacer, wherein the first bridge pattern includes a first chalcogenization portion and a second chalcogenization portion, the first chalcogenization portion overlapping the gate structure, the second chalcogenization portion overlapping the gate spacer and being laterally offset from the gate structure, and a first concentration of the chalcogen element in the second chalcogenization portion is lower than a second concentration of the chalcogen element in the first chalcogenization portion.

2. The semiconductor device of claim 1, wherein the two-dimensional chalcogenide is a compound represented by a chemical formula $A_2B_3$, where A is one or more elements selected from the group consisting of silicon (Si) and germanium (Ge), and B is one or more elements selected from the group consisting of sulfur(S), selenium (Se), and tellurium (Te).

3. The semiconductor device of claim 2, wherein the two-dimensional chalcogenide includes silicon telluride ($Si_2Te_3$).

4. The semiconductor device of claim 1, wherein the first concentration of the chalcogen element in the second chalcogenization portion decreases as a distance from the first chalcogenization portion increases.

5. The semiconductor device of claim 1, wherein the gate structure includes a gate dielectric film and a gate electrode sequentially stacked on the first bridge pattern, and a portion of the gate dielectric film extends along an inner side surface of the gate spacer.

6. The semiconductor device of claim 5, further comprising:

an oxide film interposed between the first bridge pattern and the gate dielectric film, wherein the oxide film includes a first oxide of the semiconductor element and a second oxide of the chalcogen element.

7. The semiconductor device of claim 6, wherein the oxide film includes a first oxidizing portion overlapping the gate structure and a second oxidizing portion overlapping the gate spacer, and a third concentration of the chalcogen element in the second oxidizing portion is lower than a fourth concentration of the chalcogen element in the first oxidizing portion.

8. The semiconductor device of claim 6, wherein the two-dimensional chalcogenide includes silicon telluride ($Si_2Te_3$), and the oxide film includes silicon oxide ($SiO_2$) and β-tellurium oxide (β-$TeO_2$).

9. The semiconductor device of claim 1, wherein the first bridge pattern further includes a base portion including the semiconductor element and not including the chalcogen element, the first chalcogenization portion is interposed between the gate structure and the base portion, and the second chalcogenization portion is interposed between the gate spacer and the base portion.

10. The semiconductor device of claim 1, further comprising:

a second bridge pattern spaced from the substrate farther than the first bridge pattern and extending in the first direction, the second bridge pattern penetrating through the gate structure and the gate spacer and including the two-dimensional chalcogenide, wherein the second bridge pattern includes a first oxidizing portion overlapping the gate structure and a second oxidizing portion overlapping the gate spacer, and a third concentration of the chalcogen element in the second oxidizing portion is lower than a fourth concentration of the chalcogen element in the first oxidizing portion.

11. A semiconductor device comprising:

a substrate;

a bridge pattern spaced apart from the substrate and extending in a first direction, the bridge pattern including a two-dimensional chalcogenide;

a gate structure extending in a second direction intersecting the first direction on the substrate, the bridge pattern penetrating through the gate structure;

gate spacer extending along a side surface of the gate structure the bridge pattern penetrating the gate spacer; and a source/drain pattern connected to the bridge pattern on a side surface of the gate structure, wherein the two-dimensional chalcogenide is a semiconductor material layer including a chalcogen element, and the bridge pattern includes a first chalcogenization portion and a second chalcogenization portion, the first chalcogenization portion overlapping the gate structure, the second chalcogenization portion overlapping the gate spacer and being laterally offset from the gate structure.

12. The semiconductor device of claim 11, wherein the semiconductor material layer includes at least one of silicon (Si) and germanium (Ge), and the chalcogen element is one or more elements selected from the group consisting of sulfur(S), selenium (Se), and tellurium (Te).

13. The semiconductor device of claim 11, wherein the two-dimensional chalcogenide includes silicon telluride ($Si_2Te_3$).

14. The semiconductor device of claim 11, wherein the second chalcogenization portion is between the first chalcogenization portion and the source/drain pattern, and a first concentration of the chalcogen element in the second chalcogenization portion is lower than a second concentration of the chalcogen element in the first chalcogenization portion.

15. The semiconductor device of claim 14, wherein the first concentration of the chalcogen element in the second chalcogenization portion decreases as a distance from the first chalcogenization portion increases.

16. A semiconductor device comprising:

a substrate;

a plurality of bridge patterns sequentially stacked on the substrate, spaced apart from each other, and extending in a first direction;

a gate electrode extending in a second direction intersecting the first direction on the substrate, the plurality of bridge patterns penetrating through the gate electrode;

a gate spacer extending along a side surface of the gate electrode, the plurality of bridge patterns penetrating through the gate spacer;

a gate dielectric film interposed between each of the plurality of bridge patterns and the gate electrode and between the gate electrode and the gate spacer; and a source/drain pattern connected to the plurality of bridge patterns on a side surface of the gate spacer, wherein each of the plurality of bridge patterns includes a first chalcogenization portion and a second chalcogenization portion, the first chalcogenization portion overlapping the gate electrode, the second chalcogenization portion overlapping the gate spacer and being laterally offset from the gate electrode, the first chalcogenization portion includes $Si_2Te_{3-x}$ (where $0 \le x < 3$), and the second chalcogenization portion includes $Si_2Te_{3-y}$ (where $y > x$ and $0 < y \le 3$).

17. The semiconductor device of claim 16, wherein a concentration of tellurium (Te) in the second chalcogenization portion decreases as a distance from the first chalcogenization portion increases.

18. The semiconductor device of claim 16, further comprising:

an oxide film interposed between each of the plurality of bridge patterns and the gate dielectric film, wherein the oxide film includes silicon oxide ($SiO_2$) and β-tellurium oxide (β-$TeO_2$).

19. The semiconductor device of claim 18, wherein the oxide film includes a first oxidizing portion overlapping the gate electrode and a second oxidizing portion overlapping the gate spacer, and a first concentration of tellurium (Te) in the second oxidizing portion is lower than a second concentration of tellurium (Te) in the first oxidizing portion.

20. The semiconductor device of claim 16, further comprising:

an internal spacer on a side surface of the gate electrode between each of the plurality of bridge patterns, wherein at least a portion of the second chalcogenization portion overlaps the internal spacer.

* * * * *